(12) United States Patent  
Scanlan et al.

(10) Patent No.: US 9,196,509 B2  
(45) Date of Patent: Nov. 24, 2015

(54) SEMICONDUCTOR DEVICE AND METHOD OF ADAPTIVE PATTERNING FOR PANELIZED PACKAGING

(71) Applicant: DECA Technologies Inc., Tempe, AZ (US)

(72) Inventors: Christopher M. Scanlan, Chandler, AZ (US); Timothy L. Olson, Phoenix, AZ (US)

(73) Assignee: DECA Technologies Inc, Tempe, AZ (US)

( * ) Notice: Subject to any disclaimer, the term of this patent is extended or adjusted under 35 U.S.C. 154(b) by 323 days.

(21) Appl. No.: 13/891,006

(22) Filed: May 9, 2013

(65) Prior Publication Data

US 2013/0280826 A1 Oct. 24, 2013

Related U.S. Application Data

(63) Continuation-in-part of application No. 12/876,915, filed on Sep. 7, 2010, now Pat. No. 8,799,845.

(60) Provisional application No. 61/305,125, filed on Feb. 16, 2010, provisional application No. 61/722,679, filed on Nov. 5, 2012.

(51) Int. Cl.
*H01L 21/56* (2006.01)
*H01L 23/544* (2006.01)
(Continued)

(52) U.S. Cl.
CPC ............... *H01L 21/56* (2013.01); *H01L 22/20* (2013.01); *H01L 23/49816* (2013.01); *H01L 23/5389* (2013.01); *H01L 23/544* (2013.01); *H01L 24/19* (2013.01); *H01L 24/20* (2013.01); *H01L 22/12* (2013.01); *H01L 2223/54426* (2013.01); *H01L 2223/54486* (2013.01); *H01L 2224/0401* (2013.01); *H01L 2224/04105* (2013.01); *H01L 2224/12105* (2013.01); *H01L 2224/131* (2013.01); *H01L 2224/14131* (2013.01); *H01L 2224/2105* (2013.01); *H01L 2224/221* (2013.01); *H01L 2924/01322* (2013.01); *H01L 2924/12041* (2013.01); *H01L 2924/1306* (2013.01);
(Continued)

(58) Field of Classification Search
None
See application file for complete search history.

(56) References Cited

U.S. PATENT DOCUMENTS 5,359,496 A  10/1994  Kornrumpf et al.
5,465,217 A  11/1995  Yip et al.
(Continued)

FOREIGN PATENT DOCUMENTS

RU  2183882 C2  6/2002

*Primary Examiner* — A. M. Thompson
(74) *Attorney, Agent, or Firm* — Booth Udall Fuller, PLC

(57) ABSTRACT

An adaptive patterning method and system for fabricating panel based package structures is described. A plurality of semiconductor die comprising a copper column disposed over the active surface of each semiconductor die is provided. An embedded die panel is formed by disposing an encapsulant around each of the plurality of semiconductor die. A true position and rotation of each semiconductor die within the embedded die panel is measured. A unit-specific pattern is formed to align with the true position of each semiconductor die in the embedded die panel. The unit-specific pattern as a fan-out structure disposed over the semiconductor die, over the encapsulant, and coupled to the copper columns. A fan-in redistribution layer (RDL) can extend over the active surface of each semiconductor die such that the copper columns formed over the fan-in RDLs. The unit-specific pattern can be directly coupled to the copper columns.

20 Claims, 21 Drawing Sheets

(51) Int. Cl.
  *H01L 23/00*      (2006.01)
  *H01L 23/498*     (2006.01)
  *H01L 23/538*     (2006.01)
  *H01L 21/66*      (2006.01)

(52) U.S. Cl.
  CPC . *H01L2924/13091* (2013.01); *H01L 2924/181* (2013.01)

(56) References Cited

U.S. PATENT DOCUMENTS

| | | | |
|---|---|---|---|
| 6,249,047 B1 | 6/2001 | Corisis | |
| 6,392,301 B1 | 5/2002 | Waizman et al. | |
| 6,404,643 B1 * | 6/2002 | Chung | 361/737 |
| 6,433,419 B2 | 8/2002 | Khandros et al. | |
| 6,655,011 B1 | 12/2003 | Kornrumpf et al. | |
| 6,836,023 B2 | 12/2004 | Joshi et al. | |
| 6,851,100 B1 * | 2/2005 | You et al. | 700/121 |
| 7,078,272 B2 | 7/2006 | Ho et al. | |
| 7,514,273 B2 | 4/2009 | Hedler et al. | |
| 7,659,622 B2 | 2/2010 | Dauksher et al. | |
| 7,725,862 B2 | 5/2010 | Hummler | |
| 7,772,696 B2 | 8/2010 | Hunter | |
| 7,928,563 B2 * | 4/2011 | Bakir et al. | 257/713 |
| 7,979,813 B2 | 7/2011 | Rumsey et al. | |
| 8,004,095 B2 | 8/2011 | Shim et al. | |
| 8,053,279 B2 * | 11/2011 | Farnworth et al. | 438/113 |
| 8,084,871 B2 | 12/2011 | Rahim et al. | |
| 8,822,268 B1 * | 9/2014 | Magnus | 438/107 |
| 2001/0020735 A1 | 9/2001 | Chikawa et al. | |
| 2003/0066040 A1 | 4/2003 | Morgan | |
| 2003/0090006 A1 * | 5/2003 | Farnworth | 257/787 |
| 2003/0124868 A1 | 7/2003 | Mizukoshi | |
| 2004/0032013 A1 | 2/2004 | Cobbley et al. | |
| 2004/0049912 A1 | 3/2004 | Akagawa et al. | |
| 2005/0248022 A1 | 11/2005 | Badr et al. | |
| 2006/0168552 A1 | 7/2006 | Farnworth et al. | |
| 2007/0249067 A1 | 10/2007 | Hedler et al. | |
| 2008/0136004 A1 | 6/2008 | Yang et al. | |
| 2008/0178127 A1 | 7/2008 | Dewkett et al. | |
| 2008/0230889 A1 | 9/2008 | Standing | |
| 2008/0237828 A1 | 10/2008 | Yang | |
| 2008/0288908 A1 | 11/2008 | Hart et al. | |
| 2009/0057888 A1 | 3/2009 | Hunter | |
| 2010/0180249 A1 | 7/2010 | Rumsey et al. | |
| 2010/0203676 A1 | 8/2010 | Theuss et al. | |
| 2010/0230795 A1 | 9/2010 | Kriman et al. | |
| 2010/0301474 A1 | 12/2010 | Yang | |
| 2011/0074041 A1 | 3/2011 | Leung | |
| 2011/0108981 A1 | 5/2011 | Rahim et al. | |
| 2011/0154277 A1 | 6/2011 | Ankenbauer et al. | |
| 2011/0202896 A1 | 8/2011 | Scanlan et al. | |
| 2013/0113091 A1 * | 5/2013 | Meng et al. | 257/734 |

* cited by examiner

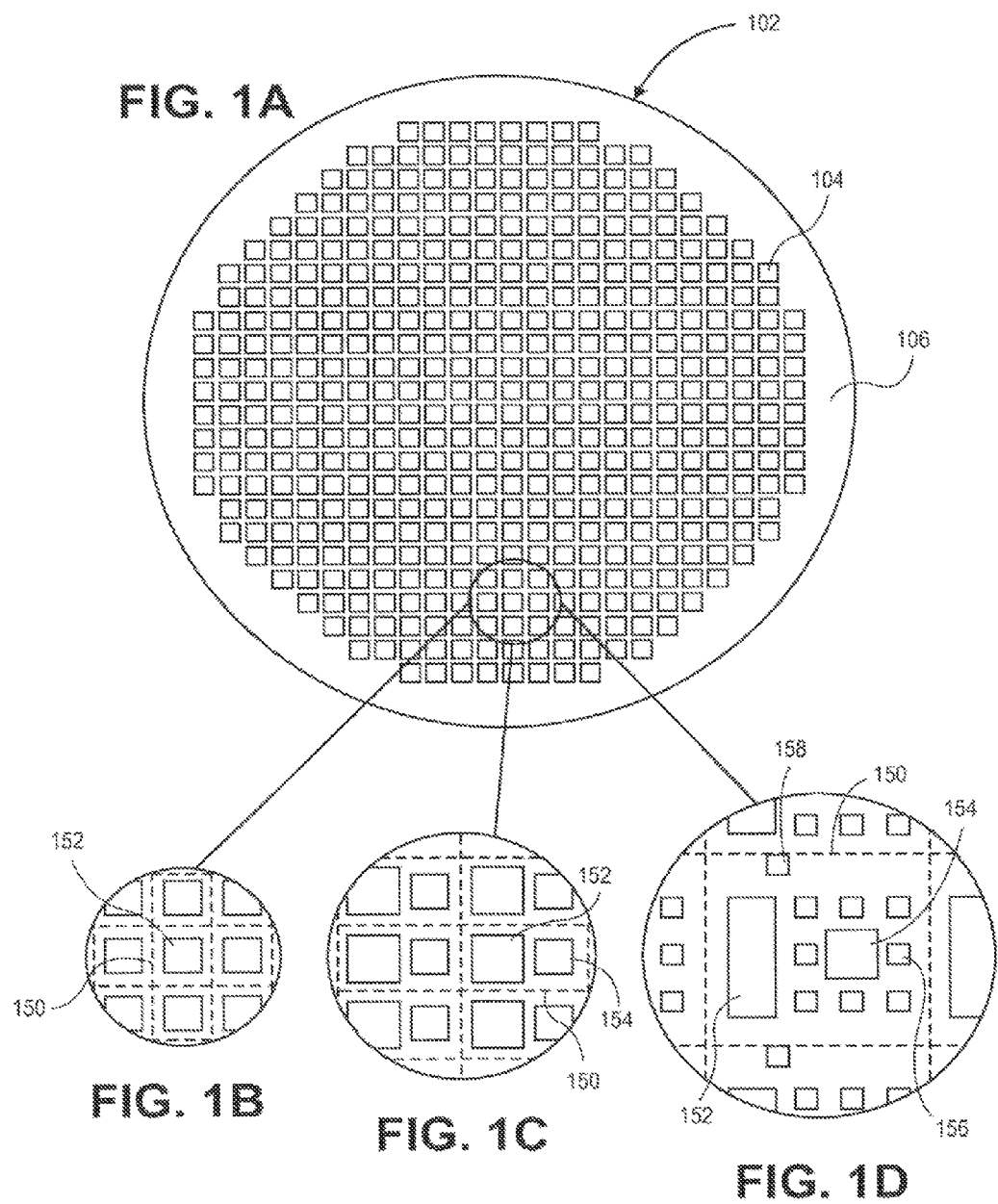

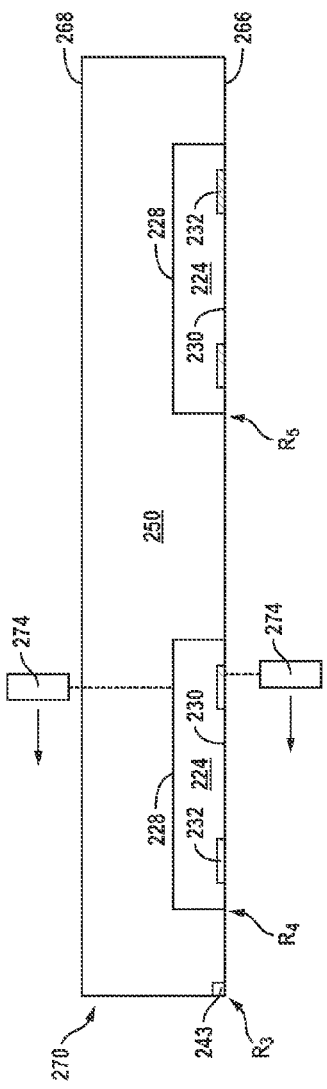
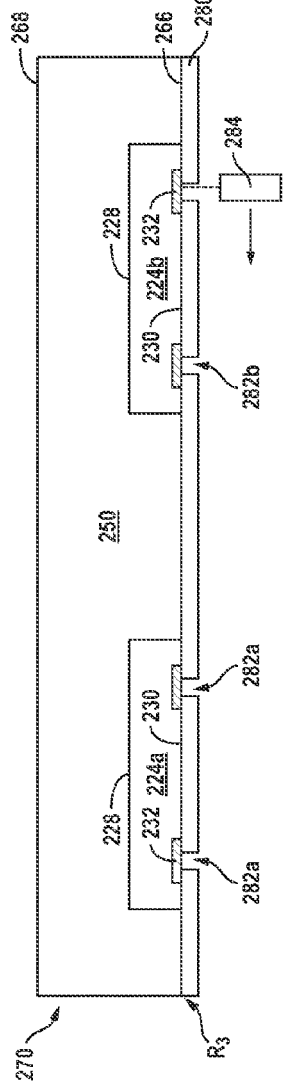
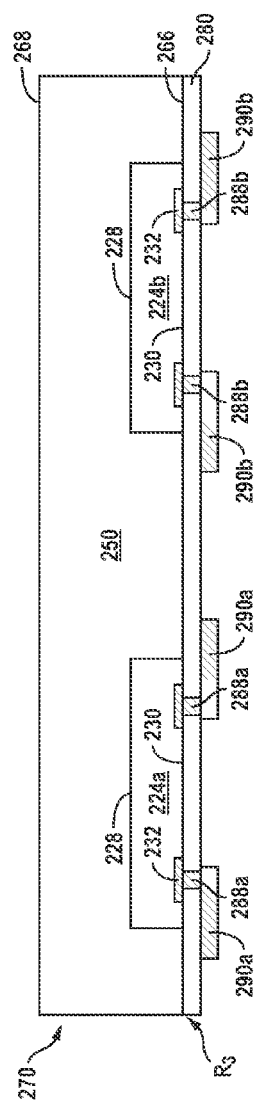

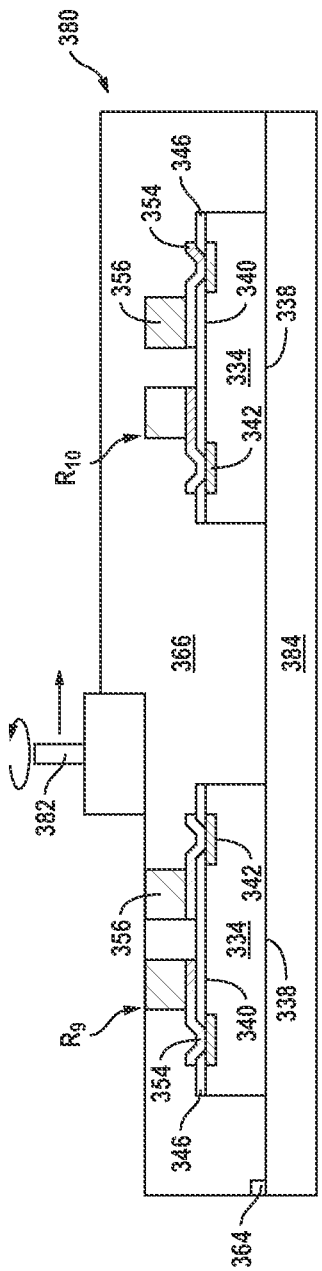
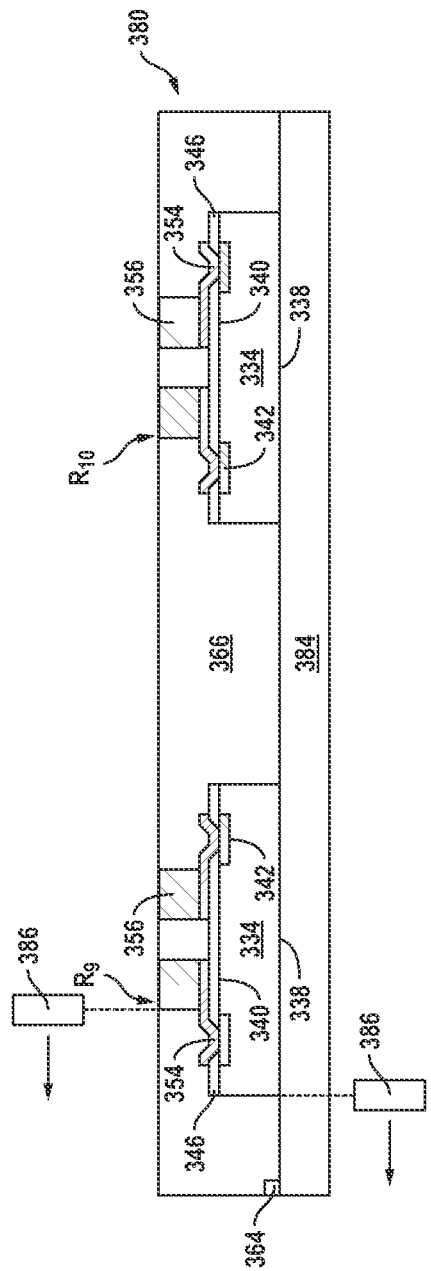

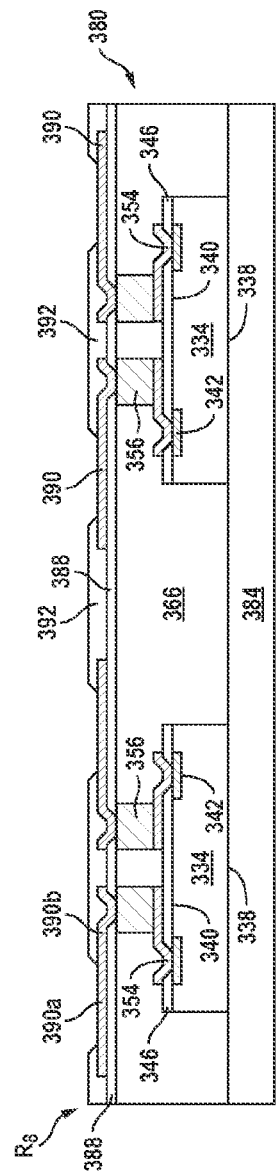
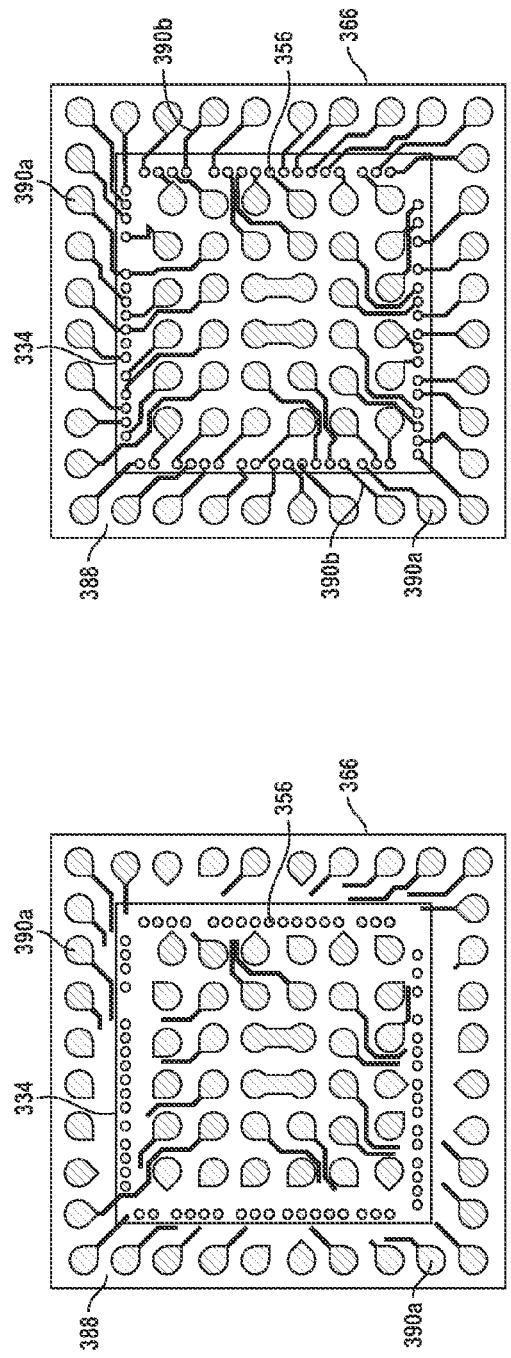
FIG. 13E
FIG. 13F
FIG. 13G

SEMICONDUCTOR DEVICE AND METHOD OF ADAPTIVE PATTERNING FOR PANELIZED PACKAGING

CROSS REFERENCE TO RELATED APPLICATIONS

This application is a continuation-in-part application of U.S. patent application Ser. No. 12/876,915, titled "Adaptive Patterning for Panelized Packaging," filed Sep. 7, 2010, which application claims the benefit of U.S. Provisional Application No. 61/305,125, filed Feb. 16, 2010, the disclosures of which are hereby incorporated herein by this reference. This application also claims the benefit of U.S. Provisional Application No. 61/722,679, filed Nov. 5, 2012.

TECHNICAL FIELD

The disclosure relates in general to semiconductor devices and, more particularly, to adaptive patterning in the field of panelized packaging for the formation of fan-out wafer level packaging (FOWLP).

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

One approach to back-end processing that more efficiently produces packaged semiconductor devices is the use of panelized packaging, in which a number of semiconductor die are formed into a panel and processed simultaneously at a level of a reconstituted wafer or panel. One form of panelized packaging used to package semiconductor die is FOWLP. FOWLP involves placing multiple semiconductor die "face down" or with an active surface of the semiconductor die oriented toward a temporary carrier or substrate, such as a temporary tape carrier. The semiconductor die and substrate or carrier is overmolded with an encapsulant, such as an epoxy molding compound, using, for example, a compression molding process. After molding, the carrier tape is removed to expose the active surface of the multiple semiconductor die formed together as a reconstituted wafer. Subsequently, a wafer level chip scale package (WLCSP) build-up interconnect structure is formed on top of the reconstituted wafer. Conductive bumps are then formed over the build-up interconnect structure as a ball grid array (BGA), which is attached to the reconstituted wafer. After formation of the BGA, the reconstituted wafer is singulated to form individual semiconductor devices or packages. Sometimes, semiconductor die are displaced in the process of being mounted to the substrate and are also displaced during the overmolding processes. Displacement of the semiconductor die, including rotation of the semiconductor die, can result in defective semiconductor packages that decrease package quality and reliability and further increase package yield loss.

SUMMARY

The foregoing and other aspects, features, and advantages will be apparent to those artisans of ordinary skill in the art from the DESCRIPTION and DRAWINGS, and from the CLAIMS.

Accordingly, in one aspect, the present invention is a method of making a semiconductor device that can comprise providing a plurality of semiconductor die comprising a copper column disposed over the active surface of each of the semiconductor die, forming an embedded die panel by disposing an encapsulant around each of the semiconductor die, measuring a true position of each semiconductor die within the embedded die panel, and forming a unit-specific pattern to align with the true position of each semiconductor die in the embedded die panel.

The method of making the semiconductor device can further comprise forming the embedded die panel by providing a carrier, mounting the plurality of semiconductor die face down on the carrier, and disposing the encapsulant around each of the plurality of semiconductor die and around each copper column. The method can further comprise forming the embedded die panel by providing a carrier, mounting the plurality of semiconductor die face up on the carrier, and disposing the encapsulant around each of the plurality of semiconductor die and around each copper column. The method can further comprise removing the carrier to expose a backside of each semiconductor die. The method can further comprise forming a fan-in redistribution layer (RDL) extending over the active surface of each semiconductor die, and forming the copper columns over the fan-in RDL. The method can further comprise forming the unit-specific pattern as a fan-out structure disposed over the plurality of semiconductor die, over the encapsulant, and coupled to the copper columns. The method can further comprise forming the unit-specific pattern as a conductive layer directly on the encapsulant and coupled to the copper columns.

In another aspect, the present invention is a method of making a semiconductor device that can comprise providing a plurality of semiconductor die comprising an interconnect structure disposed over the active surface of each semiconductor die, forming an embedded die panel by disposing an encapsulant around each of the plurality of semiconductor die, measuring a true position of each semiconductor die within the embedded die panel, and forming a unit-specific pattern to align with the true position of each semiconductor die in the embedded die panel.

The method of making the semiconductor device can further comprise providing the interconnect structures by forming the interconnect structures as copper columns. The method can further comprise forming bumps over each copper column such that the bumps align with a respective outline of each semiconductor device. The method can further comprise forming each of the semiconductor die comprising a contact pad, and forming the copper columns over the contact pads of each of the respective semiconductor die. The method can further comprise forming a backside coating over a backside of each of the plurality of semiconductor die before forming the encapsulant around the semiconductor die. The method can further comprise disposing a backside coating over a backside of each of the plurality of semiconductor die and over a surface of the encapsulant disposed around the plurality of semiconductor die. The method can further comprise measuring the true position of each semiconductor die with respect to a global fiducial.

In another aspect, the present invention is a method of making a semiconductor device that can comprise providing a die panel comprising a plurality of semiconductor die comprising interconnect structures and embedded in an encapsulant, measuring a true position of each semiconductor die within the die panel, and forming a unit-specific pattern aligned with the true position of each interconnect structure.

The method of making the semiconductor device can further comprise forming the encapsulant around the semiconductor die without forming the encapsulant over backsides of the semiconductor die such that the backsides of the semiconductor die are exposed with respect to the encapsulant. The method can further comprise forming the unit-specific patterns to align with the true position of each semiconductor die in the die panel by selecting from a number of pre-determined unit-specific pattern designs a unit-specific pattern with a best fit for the true position of each of the plurality of semiconductor die. The method can further comprise forming bumps over each unit-specific pattern such that the bumps align with a respective outline of each semiconductor device. The method can further comprise providing the interconnect structures by forming the interconnect structures as copper columns. The method can further comprise forming the unit-specific pattern as a conductive layer, forming an insulating layer of polybenzoxazoles, polyimide, or epoxy solder mask over the unit-specific pattern, forming openings in the insulating layer over the unit-specific pattern to define land grid array pads, and forming low profile bumps over the land grid array pads.

BRIEF DESCRIPTION OF THE DRAWINGS

FIG. 1A illustrates a top view of a reconstituted wafer in accordance with an embodiment.

FIGS. 1B-1D illustrate a top view of a plurality of packages or modules arranged in a reconstituted wafer in accordance with embodiments of the disclosure.

FIGS. 11A-11H illustrate cross-sectional side views in a method of forming a FOWLP in accordance with an embodiment of the disclosure.

FIGS. 13A-13H illustrate cross-sectional side views in a method for forming a FOWLP in accordance with an embodiment of the disclosure.

DETAILED DESCRIPTION

Figure 2A:
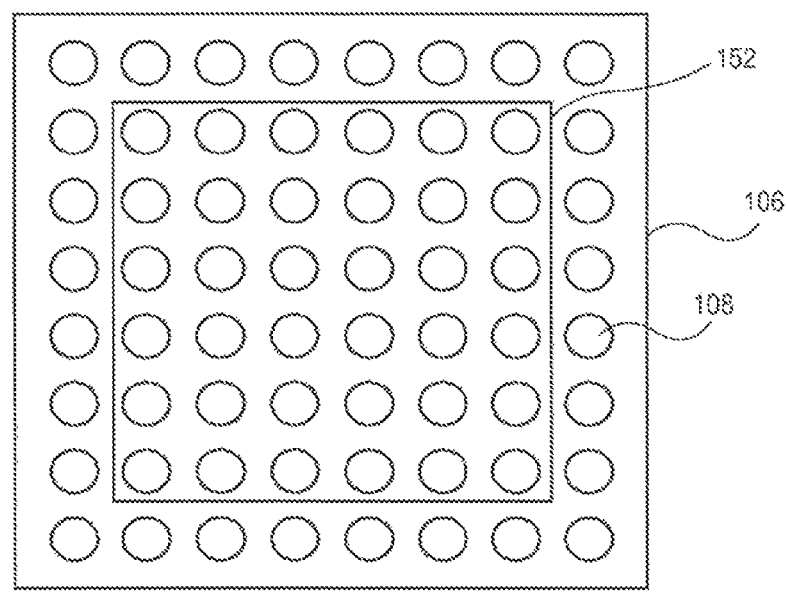
FIG. 2A illustrates a top view of a FOWLP in accordance with an embodiment of the disclosure.

Embodiments of the disclosure disclose methods and systems to improve panelized packaging. In accordance with embodiments of the disclosure, misalignment for individual device units in a panel or reticulated wafer may be adjusted for by measuring the misalignment for each individual device unit and adjusting the position or design of a feature in the build-up layer for each respective device unit utilizing a mask-less patterning technique.

In the following description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGs. are illustrative representations and are not necessarily drawn to scale.

The terms "over," "between," and "on" as used herein refer to a relative position of one layer with respect to other layers. One layer deposited or disposed above or under another layer may be directly in contact with the other layer or may have one or more intervening layers. One layer deposited or disposed between layers may be directly in contact with the layers or may have one or more intervening layers. In contrast, a first layer "on" a second layer is in contact with that second layer.

In accordance with embodiments of the disclosure, a plurality of device units may be assembled and molded to create a panel, or reticulated wafer. Device units may be active device units such as dies, and may also be passive device units such as an integrated passive network, or a discrete passive device unit such as a capacitor, resistor, or inductor. The device units may be pre-packaged, though pre-packaging is not required. In accordance with embodiments of the disclosure, the pre-packages may contain single or a plurality of device units and other components. The panel is inspected to measure the true position for each device unit in the panel. For example, the measured position may include an x-y position and/or orientation of at least one feature from each device unit with respect to a global fiducial(s) on the panel. A unit-specific pattern for each individual device unit is then created based upon the measured position for each respective individual device unit, and provided to a laser, direct write imaging system or other mask-less patterning system. The unit-specific patterns are then formed over each of the plurality of device units so that each unit-specific pattern is aligned with the respective device unit.

In an embodiment, creating the pattern relates to adjusting the position or design of a unit detail pattern in a chip scale package (CSP) build-up structure to align with the measured position of each device unit in the panel. In an embodiment, the unit detail pattern is a first via pattern, a capture pad, or an interconnecting trace pattern which may or may not be associated with an RDL. For example, the position of a first via pattern can be adjusted so that it is formed in alignment with the measured position of each device unit in the panel. Also, an RDL layer, including at least a capture pad for the first via may be adjusted or designed to maintain alignment with the true position of each device unit in the panel. The final under bump metallurgy (UBM) and BGA ball may be formed without aligning with respect to the measured position of the device unit. As such, the UBM pad and BGA ball may be aligned consistently with respect to the package outline for each device unit, maintaining conformance to the package outline.

Adaptive patterning may also be utilized to create a plurality of module-specific patterns across the panel. In accordance with embodiments of the disclosure, a plurality of device units and optionally other components may be assembled and molded to create a panel, or reticulated wafer. The other components may be optical elements, connectors (for example to connect to the outside of the module) and other electronic components, which may also be pre-packaged. In an embodiment, a module includes a plurality of device units. A module may also include at least one device unit and another component. A panel including a plurality of arrangements of a plurality of device units, or at least one device unit and at least one additional component is inspected to measure the true position for each device unit and optional other component in the panel. For example, the measured position may include an x-y position and/or orientation of at least one feature from each device unit and optional other component within a module with respect to a global fiducial(s) on the panel. A module-specific pattern for each module is then created based upon the measured position for each respective individual device unit and optional other component within the respective module, and provided to a laser, direct write imaging system or other mask-less patterning system. The module-specific patterns are then formed over each of the plurality of device units and optional other components so that each module-specific pattern is aligned with the respective module device units and optional other components.

Creating the module-specific pattern may relate to adjusting the position or design of a unit or component detail pattern in a CSP build-up structure to align with the measured position of each device unit or component in the panel as previously described with regard to the single device unit package embodiment. Where multiple devices and optional other components exist, device interconnect traces which may or may not be associated with a RDL may exist. A multi-layer build-up structure can also be utilized for both modules as well as single device packages.

Referring to FIG. 1A, in an embodiment, the process begins with a panel 102 including a plurality of device units 104 overmolded with an encapsulating material 106 such as an epoxy resin. While FIG. 1A illustrates a circular panel 102, alternative panel formats such as rectangular or square may be utilized. As illustrated in FIG. 1A, the active surfaces of the plurality of device units 104 are substantially flush with the encapsulating material 106. In an embodiment, panel 102 may be what is known in the art as a reconstituted wafer formed in a WLP technique where the plurality of device units are placed face down on a temporary tape carrier, followed by overmolding with epoxy molding compound using a compression molding process, followed by removal of the temporary tape carrier leaving the active surfaces of the plurality of die units exposed.

Subsequently, a build-up structure may be formed on top of the structure illustrated in FIG. 1A and the device units are singulated to form packages or modules. For example, as illustrated in FIG. 1B, the panel may be singulated into a plurality of single-die packages 150, each package including a single semiconductor die unit 152. Referring to FIG. 1C, a plurality of die units 152, 154 may be mounted within the molded panel and singulated to form multi-die packages or modules 150. Referring to FIG. 1D, a single die unit 152 or a plurality of die units 152, 154 may be mounted within the molded panel with the addition of a passive device(s) 156 (such as capacitor, inductor or resistor) and/or other component(s) 158 (such as an optical element, connector or other electronic component) and singulated to form a packages or modules 150 which include both an active device(s) and a passive device(s) and/or other components. A variety of combinations of active and passive devices and optionally other components within packages or modules are envisioned in accordance with embodiments of the disclosure. Accordingly, the particular configurations illustrated in FIGS. 1B-1D are meant to be illustrated rather than limiting.

In the following discussion, certain embodiments are described with regard to the formation of a single die FOWLP, though embodiments of the disclosure are not limited to such. Embodiments of the disclosure may be used in any panelized packaging application including single-die applications, multi-die modules, some combination of a die(s) and a passive component(s) within a module, or some combination of a device unit(s) and another component(s) within a module. In one aspect, embodiments of the disclosure may eliminate or reduce package or module assembly yield loss caused by misalignment of the device unit or other component during panelization. In another aspect, embodiments of the disclosure may maintain compliance to the package or module outline and not require changes to the position of UBM pads or BGA balls. Maintaining compliance with the package or module outline can be consistently achieved in the final product, for example as end-product package, test socket, etc. In another aspect, embodiments of the disclosure may allow for a smaller bond pad opening on the device units.

Figure 2B:
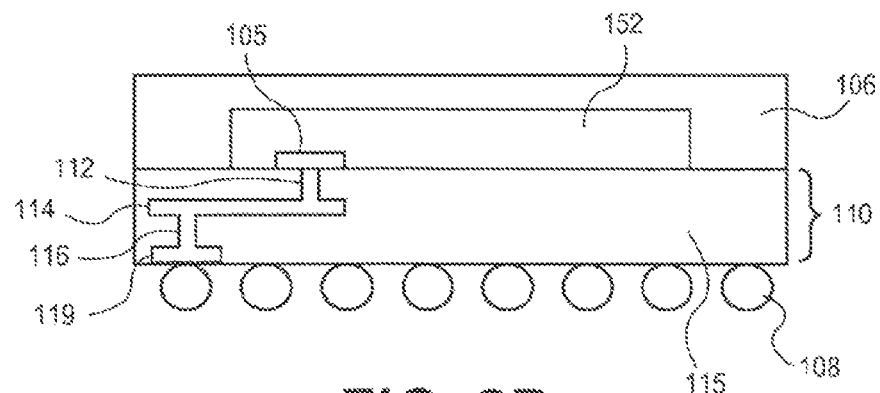
FIG. 2B illustrates a cross-sectional side view of a FOWLP in accordance with an embodiment of the disclosure.

Referring now to FIGS. 2A-2B, ball grid array (BGA) balls 108 are attached and the panel is saw singulated to form individual packages. The CSP build-up structure 110 may be formed over the active surface of each individual die unit before singulation. While build-up structure 110 in FIG. 2B is illustrated as including a single dielectric layer 115, it is understood that multiple layers may be used to form build-up structure 110. Build-up structure 110 may be formed from a dielectric material 115 within which is included a first via 112 which is in electrical contact with a bond pad 105 of the die unit 152. An RDL 114 is formed which may span under the bond pad 105, first vial 12, and over a UBM via 116, UBM pad 119, and BGA ball 108. BGA ball 108 is illustrated in FIG. 2B as a solder ball, though is not limited to such. In other embodiments, multiple dielectric layers and device interconnect traces, which may or may not be associated with the RDL, are formed in accordance with the principles described herein. Such multi-layer build-up structures can be utilized in both single-die package applications as well as multi-device modules.

Figure 3A:
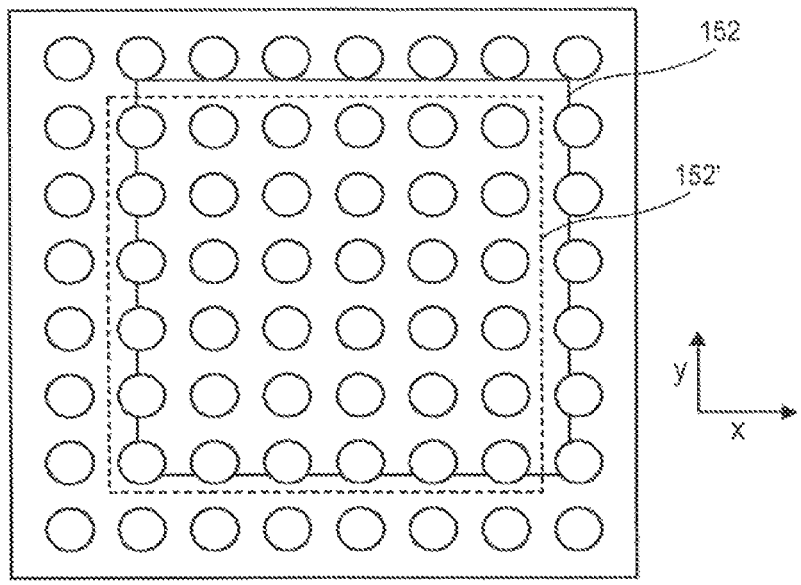
FIG. 3A illustrates a top view of the actual position of a package die having a different x-y position than that of the nominal, reference position in accordance with an embodiment of the disclosure.
Figure 3B:
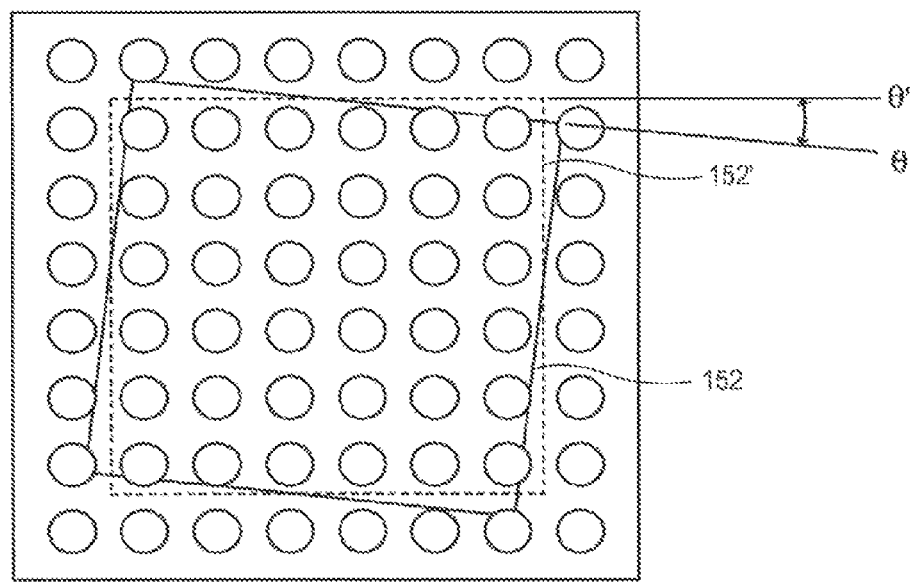
FIG. 3B illustrates a top view of the actual position of a package die having a different orientation than that of the nominal, reference orientation in accordance with an embodiment of the disclosure.

It has been observed that die unit placement and overmolding may cause displacement and/or rotation of the orientation of any of the plurality of die units 152 on the temporary tape carrier. This may be attributed to the die units not being rigidly attached to the temporary tape carrier as well as shrinkage of the molding compound during curing of the molding compound. As a result, the plurality of die units 152 on panel 102 may not lie in their nominal, reference positions after compression molding. As illustrated in FIG. 3A, the actual position of a die unit 152 may have a different x-y position than that of the nominal, reference position 152' of the die unit. As illustrated in FIG. 3B, the actual position of the die unit 152 may be rotated such that it has a different orientation θ than that of the nominal, reference orientation θ' of the nominal, reference position 152'. While the difference in x-y position and orientation is illustrated in FIGS. 3A-3B with respect to the nominal, reference positions of the die unit within an individual singulated package outline, it is understood that the difference in x-y position and orientation may be actually measured with regard to a global fiducial(s) within the panel or reticulated wafer.

Misalignment of the individual die units may cause some of the packages which are subsequently singulated from the panel to be defective. Conventional methods for forming a CSP build-up structure on a panel utilize mask-based patterning technologies to expose a pattern on multiple die units of the panel at the same time. The masks include fixed patterns for die pad to UBM interconnect and, therefore, lack the ability to adjust for the movement of each die within a panelized format. The impact of the conventional methods is either yield loss due to misalignment of first vias to the bond pads or the addition of some intermediate form of die pad re-routing in native wafer form (prior to panelization) to make larger die pads as targets to ensure the first vias make connection despite die movement. As a result, conventional processing technology requires that bond pads on the die units be larger than necessary to avoid yield loss from the panel, thereby reducing the application space for WLP technology.

In accordance with embodiments of the disclosure, misalignment of the individual die units is adjusted for by utilizing an adaptive patterning technique which additionally implements mask-less lithography to pattern features of the build-up structure 110. Laser ablation and direct write exposure are examples of suitable mask-less patterning techniques in accordance with embodiments of the disclosure.

In an embodiment, a panel including a plurality of die units is provided as illustrated in FIG. 1A. A true position is measured for each of the plurality of die units 152 of the panel. The measurement may be of a specific feature formed on each of the die units of the panel. For example, the position of at least one bond pad 105 on each of the plurality of die units on the panel can be measured. The specific position can be a variety of positions, such as a corner of the bond pad 105, a center of the bond pad, an outline of the bond pad, etc. Included in the position measurement may be the x-y position and/or orientation with respect to a global fiducial(s) on the panel. Any suitable inspection tool may be utilized to measure the true first position, such as an optical inspection tool. In an embodiment, a single feature is measured to obtain an x-y position of a die unit. In an embodiment, a plurality of features are measured to obtain an orientation of a die unit.

A build-up structure 110 is formed over the panel including the plurality of die units. Referring again to FIG. 2B, a singulated package is illustrated with a completed build-up structure 110. While the build-up structure 110 is illustrated as being formed over a single package in FIG. 2B, it is understood that build-up structure 110 is formed prior to singulation, and that a plurality of build-up structures 110 are formed across the panel 102 and over each of the respective plurality of die units 152 on the panel 102 illustrated in FIG. 1A.

In an embodiment, the build-up structure 110 is formed from a dielectric material 115, from which features are patterned. Build-up structure 110 may include a plurality of layers. For example, a separate dielectric layer may be formed in which the first vial 12, RDL pattern 114, and UBM via 116, and/or UBM pad 119 are separately formed. In an embodiment, there may be multiple via and RDL patterned layers. Dielectric material 115 may be opaque or translucent, and different materials can be utilized for the separate dielectric layers. Where the dielectric material 115 is opaque, optical measurements of a feature may be measured prior to forming the dielectric material 115 over the underlying feature. Where the dielectric material 115 is translucent it is possible to measure the position of a feature below the dielectric material 115 before or after forming the dielectric material over the panel.

Based upon the true measured position for each of the respective die units, a specific pattern is created for each of the plurality of die units. The pattern is unit-specific for each of the respective die units, and therefore the unit-specific patterns may be different (for example x-y position, orientation, design) for each respective die unit so that each unit-specific pattern is aligned with each respective die unit, thereby compensating for misalignment of the individual die units. Each unit-specific pattern may be a common pattern aligned with the respective die unit. Each unit-specific pattern may also be uniquely created for each die unit in accordance with embodiments of the disclosure.

Figure 4:
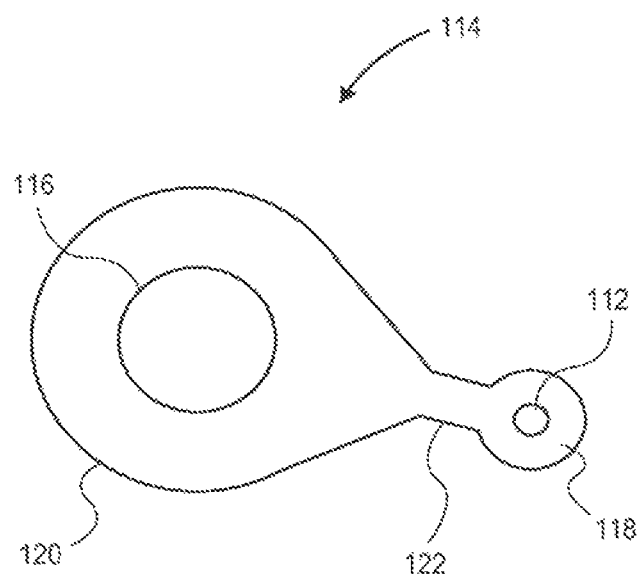
FIG. 4 illustrates an RDL pattern in accordance with an embodiment of the disclosure.

The pattern is then formed over each of the plurality of die units. In an embodiment, the pattern is a unit detail pattern formed in a build-up structure 110 such as the first via 112 which connects the bond pad 105 to the RDL pattern 114, the RDL pattern 114, or the UBM pad pattern 119. As illustrated in FIG. 4, the RDL pattern 114 of FIG. 2B may include a first via capture pad 118 aligned with the first via 112, a UBM via capture pad 120 aligned with the UBM via 116, and a trace portion 122 connecting the capture pads 121, 120. The patterned features in the build-up structure 110 may be formed utilizing a mask-less patterning system. For example, a first via 112 or RDL pattern 114 may be created through exposure of a photoimagable polymer or photoresist through a direct writing. First via 112 or RDL pattern 114 may also be created through laser ablation of dielectric material 115.

A number of methods are envisioned for creating a pattern for each of the plurality of die units based upon the measured position for each of the respective die units. In an embodiment, this may be accomplished by comparing the measured position of each of the plurality of die units to a number of defined nominal, reference positions. For example, a nominal, reference position of at least one feature on each of the plurality of die units can be defined with respect to a global fiducial(s) on the panel 102. The specific nominal, reference position can be a variety of positions, such as a corner of the bond pad 105, a center of the bond pad, an outline of the bond pad, an alignment feature, etc. The specific nominal, reference position can also be the package outline, within which the die units will be packaged. Multiple features for each unit may be used in order to determine the orientation of the die within the unit. Included in the nominal, reference position may be the x-y position and/or orientation with respect to a global fiducial(s) on the panel. In an embodiment, defining a nominal, reference position includes generating an electronic panel map. For example, the nominal, reference position (x-y position and/or orientation) of each die unit in the panel can be defined in an electronic panel map. Though embodiments do not require a panel map, and the nominal, reference positions can be provided elsewhere.

In an embodiment, the position or design of the pattern is adjusted for each die unit to align with the measured position of the respective die unit in the panel. Design software can create a pattern design for each of the plurality of die units based upon the measured position of each of the die units in the panel. This pattern design may then be stored in a panel design file, in which the x-y position and/or orientation of the pattern is adjusted. The pattern may also be changed to optimize the pattern design for each die unit. The panel design file may be transferred to a mask-less patterning system to form at least the unit-specific pattern.

Figure 5A:
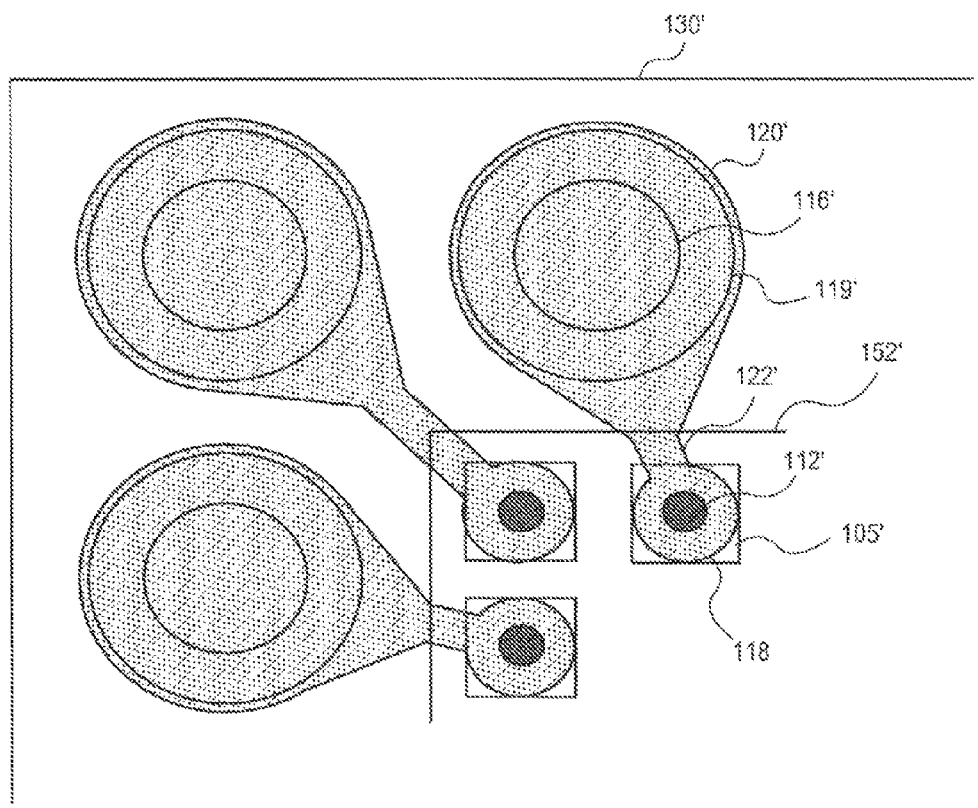
FIG. 5A illustrates a portion of panel design in accordance with an embodiment of the disclosure.

FIG. 5A illustrates a portion of a panel design in accordance with an embodiment of the disclosure. The illustration provided in FIG. 5A is meant to be exemplary of a panel design in accordance with an embodiment of the disclosure and is not meant to be limiting. As illustrated, an upper left-hand corner of an individual package outline is shown, however it is understood that the panel design may include additional or less information for the individual die package, and that the panel design may include similar information for each of the plurality of die units of the panel.

As illustrated in FIG. 5A, the panel design may define nominal, reference positions for each die within the panel, as well as nominal, reference positions for yet to be formed features. In an embodiment, the nominal, reference positions for the die 152' and bond pad 105' are defined. Features which have not yet been formed over the panel may include nominal, reference positions for the first via 112', die via capture pad 118', UBM via 116', UBM via capture pad 120', RDL pattern trace 122', UBM pad 119', and package outline 130' of a package to be singulated from the panel.

Figure 5B:
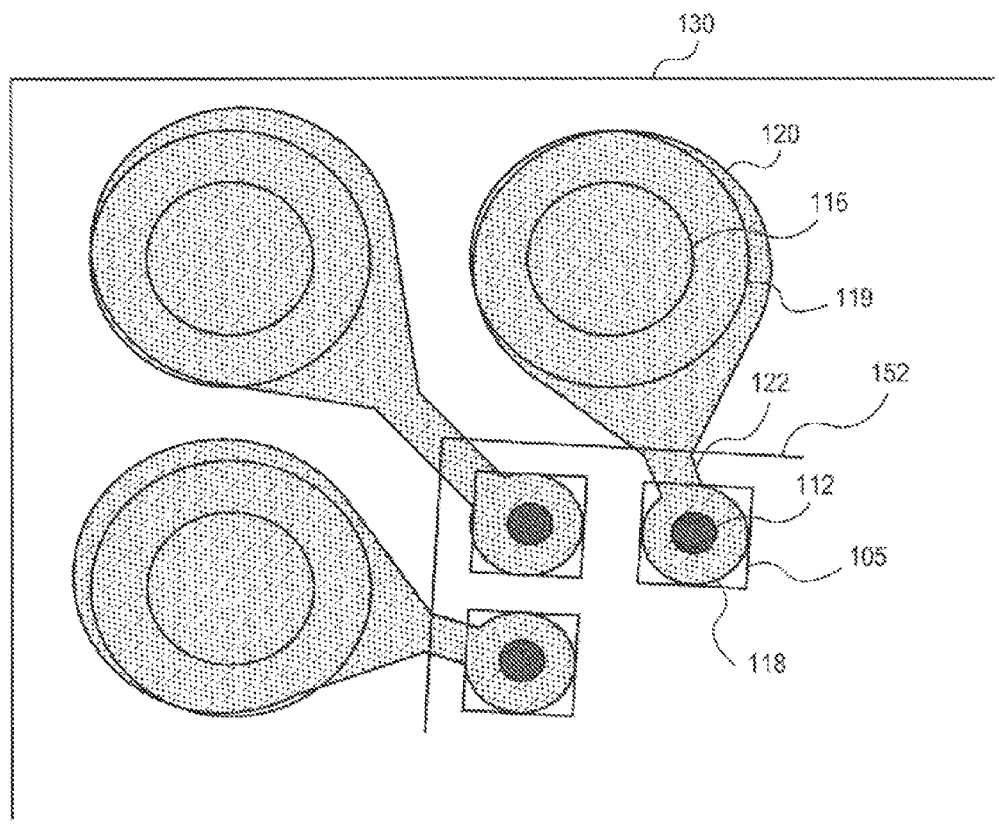
FIG. 5B illustrates a misaligned die unit in accordance with an embodiment of the disclosure.

FIG. 5B illustrates a misaligned die unit in accordance with an embodiment of the disclosure. As illustrated, die unit 152 is illustrated as being misaligned with respect to the nominal, reference die unit position 152' or global fiducial(s) on the panel (not illustrated). Likewise, the already formed die pad 105 is illustrated as being misaligned with respect to the nominal, reference die unit position 105' or global fiducial(s) on the panel (not illustrated).

In an embodiment, a nominal, reference position of at least one feature on each of the plurality of die units is defined. For example, the nominal, reference position may be die pad 105'. The true position of the die bond pad 105 is measured for each of the plurality of die units on the panel. In accordance with embodiments of the disclosure, misalignment of the individual die units is determined when the measured position of the die bond pad 105 has a different x-y position or orientation than that of the reference position of the die bond pad 105'.

In an embodiment, the position of the patterned feature (for example first via 112, die via capture pad 118, UBM via 116, UBM via capture pad 120, RDL pattern trace 122) formed in the CSP build-up structure 110 has a different x-y position or orientation than the nominal, reference position of the feature for at least one of the plurality of die units. In an embodiment, the formed first via 112 has a different x-y position as compared to the reference position of the first via 112' for at least one of the plurality of die units. In an embodiment, the formed RDL pattern 114 has a different x-y position as compared to the reference position of the RDL pattern 114' for at least one of the plurality of die units. In an embodiment, the formed RDL pattern 114 has a different x-y position and orientation as compared to the reference position of the RDL pattern 114' for at least one of the plurality of die units.

In an embodiment, the amount of misalignment of the die unit in the x-y direction and/or orientation is measured by the inspection tool, and a delta-value between the nominal, reference position and measured position of the die unit is calculated for at least one of the plurality of die units. Based upon the delta-value, the pattern to be formed is created by adjusting the pattern from its reference position by the same delta-value. It is contemplated, however, that the patterned feature may not necessarily have to be formed with the same delta-value in accordance with embodiments of the disclosure.

Other embodiments of the disclosure may maintain the relative alignment of certain features within the end package. In the embodiment illustrated in FIG. 5B, it is shown that the relative alignment between the first via 112, and the bond pad 105 and die unit 152 is the same as the relative alignment illustrated in FIG. 5A between the nominal, reference positions 112', 105', 152'. In an embodiment, any of the portions 118, 122, 120 of the RDL pattern 114, or the entire RDL pattern 114 may be shifted in FIG. 5B by the same delta-value between the true first position of the bond pad 105 and the reference bond pad position 105'.

In an embodiment, an additional feature may be formed over each of the plurality of die units without regard to the measured position of each of the respective plurality of die units. In accordance with embodiments of the disclosure UBM pad 119 is formed at the nominal, reference position 119' without regard to the measured position of each of the respective plurality of die units. In the embodiment illustrated in FIG. 5B, position of the actual positions of the UBM pad 119 and package outline 130 are the same as the corresponding nominal, reference positions 108', 130'. As illustrated, the actual position UBM via 116 may also be in the position as the nominal, reference position 116'.

Figure 6:
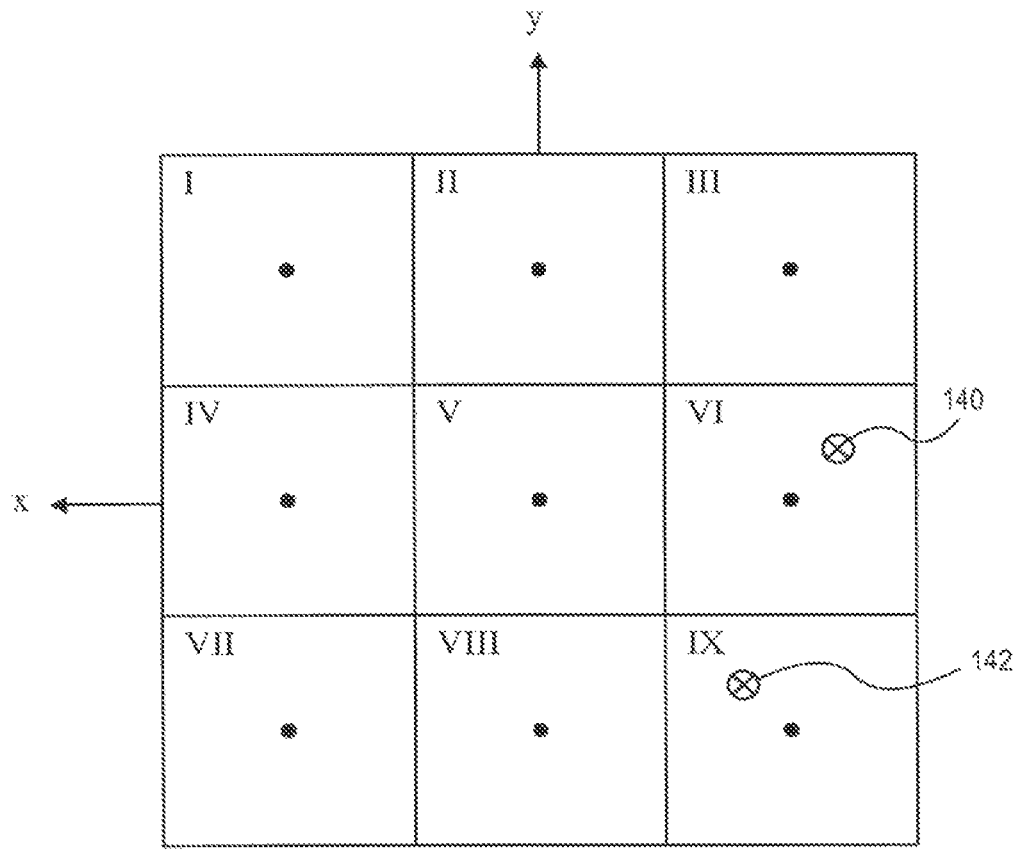
FIG. 6 illustrates a discrete plurality of different design options in accordance with an embodiment of the disclosure.

Adjusting the position of a unit detail pattern formed in the CSP build-up structure to align with the measured position of each die in the panel may also include changing the RDL pattern design. In an embodiment, changing the RDL pattern design includes selecting a best-fit RDL pattern design from a discrete plurality of different design options. An illustration of a discrete plurality of different design options is provided in FIG. 6. For example, each quadrant I-IX represents a range of delta-values between the measured position of the bond pad 105 and the reference bond pad position 105'. By way of example, if the delta-value corresponds to point 240 in FIG. 6, then the RDL pattern design for quadrant VI is selected. If the delta-value corresponds to point 142 in FIG. 6, then the RDL pattern for quadrant IX is selected. In this manner the design tool can automatically generate a given best-fit pattern for each individual die based upon the corresponding delta-value for that specific die. For example each of the different design patterns associated with the quadrants can have different sizes, shapes, and/or orientations for the RDL pattern. While FIG. 6 illustrates a nine different design options, it is to be understood that any discrete number of different design options may be used.

In an embodiment, adjusting the position of a unit detail pattern formed in the CSP build-up structure to align with the measured position of each die in the panel includes changing the RDL pattern design with a dynamic design approach. For example, a customized RDL pattern may be dynamically generated for each specific die unit based upon the corresponding delta-values for each specific die unit.

In application, several variations are envisioned in accordance with embodiments of the disclosure. For example, the manner of adjusting a unit detail pattern formed in the CSP build-up structure may depend upon the amount of adjustment required to align the unit detail pattern with the respective die in the panel. In a first level operation, where the delta-value is minimal, it is contemplated that adjustment of the first via 112 position may be sufficient to compensate for misalignment of the die 152. In a first variation, if the reference first via capture pad 118' no longer sufficiently overlaps the adjusted first via 112 position, then all or a portion of the RDL pattern 114 position may need to be adjusted by the same delta-value by which the first via 112 position was adjusted. In a second variation, where adjustment of the RDL pattern 114 position is not adequate, the design of the RDL pattern 114 may be changed so that the first via capture pad 118 is aligned to the first via 112, and the UBM via capture pad 120 is aligned with the UBM via 116. This may be accomplished by selecting a best-fit design of the RDL pattern 114 for each of the respective die units based upon the position of the delta-value in the quadrants illustrated in FIG. 6, or dynamically designing a customized RDL pattern 114 for each die unit.

As described above, an adaptive patterning technique in accordance with embodiments of the disclosure may be utilized to pattern features within a build-up structure 100, such as a first via 112 and RDL pattern 114. In an embodiment, an adaptive patterning technique may be utilized for any structure within the build-up structure. For example, build-up structure may contain multiple layers, vias, and RDL patterns. In an embodiment, an adaptive patterning technique may include measurement of a first true position followed by adaptive patterning of a first via and RDL-1, then measurement of a second true position followed by adaptive patterning of a via-2 and RDL-2, then measurement of true position 'n' followed by adaptive patterning of a via-n and RDL-n.

In accordance with embodiments of the disclosure, a lot of die packages may be singulated from a panel or reticulated wafer. The lot may be characterized by a unique statistical range of relative orientations. In conventional processes, where a plurality of die are misaligned across the panel, the statistical average across the lot for the misalignment of the first via 112 relative to the respective die 152 outline for the lot is directly proportional to the statistical average of the misalignment of the die 152 relative to the package outline 130. These relationships can be represented as follows:

$$\Delta_{(avg,lot)}(112,152) \approx \Delta_{(avg,lot)}(152,130)$$

In accordance with embodiments of the disclosure, the first via 112 may be adjusted for each individual die to compensate for misalignment of the respective die 152. Therefore, the statistical average across the lot for the misalignment of the first via 112 relative to the respective die 152 outline is considerably less than the statistical average of the misalignment of the die 152 relative to the package outline 130. These relationships can be represented as follows:

$$\Delta_{(avg,lot)}(112,152) << \Delta_{(avg,lot)}(152,130)$$

In an embodiment, the statistical average across the lot for the misalignment of the first via 112 relative to the respective die 152 outline is nil.

$$\Delta_{(avg,lot)}(112,152) = 0$$

Certain embodiments may be implemented as a computer program product that may include instructions stored on a non-transitory machine-readable medium. These instructions may be used to program a general-purpose or special-purpose processor to perform the described operations. A machine-readable medium includes any mechanism for storing or transmitting information in a form (for example, software, processing application) readable by a machine (for example, a computer). The machine-readable medium may include, but is not limited to, magnetic storage medium (for example, floppy diskette); optical storage medium (for example, CD-ROM); magneto-optical storage medium; read-only memory (ROM); random-access memory (RAM); erasable programmable memory (for example, EPROM and EEPROM); flash memory; or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

The digital processing devices described herein may include one or more general-purpose processing devices such as a microprocessor or central processing unit, a controller, or the like. Alternatively, the digital processing device may include one or more special-purpose processing devices such as a digital signal processor (DSP), an application specific integrated circuit (ASIC), a field programmable gate array (FPGA), or the like. In an alternative embodiment, for example, the digital processing device may be a network processor having multiple processors including a core unit and multiple microengines. Additionally, the digital processing device may include any combination of general-purpose processing devices and special-purpose processing devices.

Figure 7:
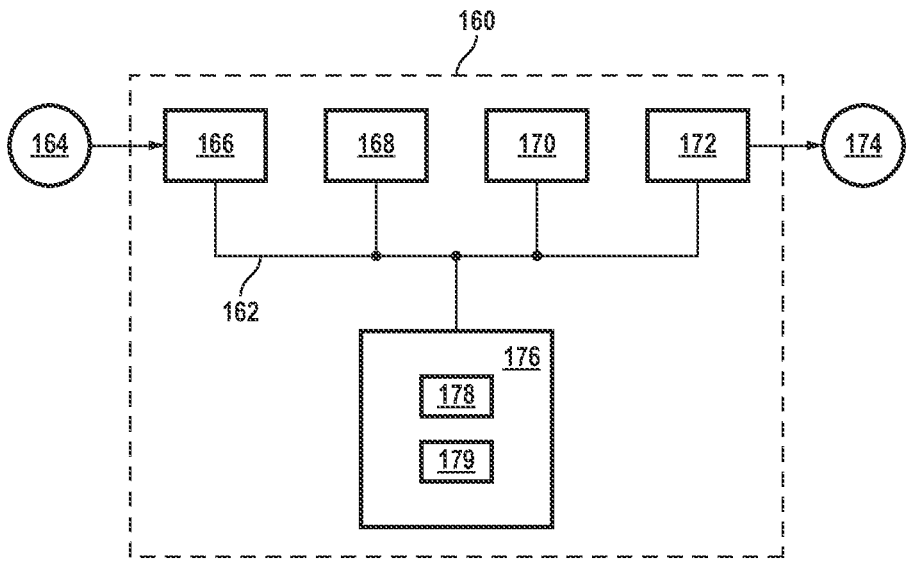
FIG. 7 illustrates an adaptive patterning system in accordance with an embodiment of the disclosure.

Embodiments of the disclosure may be performed with an adaptive patterning system 160 as illustrated in FIG. 7. Operations may be performed by hardware components, software, firmware, or a combination thereof. Any of the signals provided over various buses 162 described herein may be time multiplexed with other signals and provided over one or more common buses. As illustrated, a panel or reticulated wafer 164 may be supplied to an inspection tool 166 which measures a position of a plurality of device units on the panel and creates a file 168 containing the measured position of each of the plurality of device units. Design software stored on server 176 then creates a pattern design file 170 for each of the plurality of device units based upon the measured position of each of the plurality of device units. A patterning machine 172 imports the pattern design and creates a patterned feature over each of the plurality of device units. The panel or reticulated wafer is provided to the patterning machine 172 from the inspection tool 166. A patterned panel 174 may be output from the patterning machine 172.

In an embodiment, the design software further creates a new drawing for at least one layer of design, which is adjusted such that the first via and/or RDL pattern is aligned to the measured position of each of the plurality of device units. In an embodiment, the software includes an algorithm for adaptive patterning. For example, the algorithm may adjust the x-y position or orientation of a feature based upon a delta-value. In an embodiment, the algorithm may select a feature pattern from a discrete number of design options based upon a delta-value. In an embodiment, the algorithm may dynamically design a feature based upon a delta-value.

The schematic illustration provided in FIG. 7 is indicative of the order of a process in accordance with embodiments of the disclosure, however, it is not necessary that the actual equipment be arranged as illustrated. As illustrated, the design software is stored on a separate server 176, which can also store a panel map which includes nominal, reference positions of the plurality of device units on the panel. It is not required that the design software be stored on a separate server 176. For example, design software could be stored on the inspection tool 166 or patterning machine 172. It is possible to have all components integrated into a single system.

Server 176 can be utilized to control any part of or the entire adaptive patterning system 160. In an embodiment, server 176 includes memory 179 having instructions stored thereon, which when executed by a processor 178, cause the processor to instruct the inspection tool 166 to measure a position of each of a plurality of device units of a panel, create a unit-specific pattern for each of the respective plurality of device units based upon the measured position for each of the respective device units, and instruct the patterning tool 172 to form the unit-specific patterns over each of the plurality of device units, wherein each unit-specific pattern is aligned with the respective device unit. In an embodiment, creating a unit-specific pattern for each of the respective plurality of device units based upon the measured position for each of the respective device units may include adjusting an x-y position and/or orientation of at least one unit-specific pattern, selecting from a discrete number of design options, or dynamically generating the unit-specific pattern.

Figure 8:
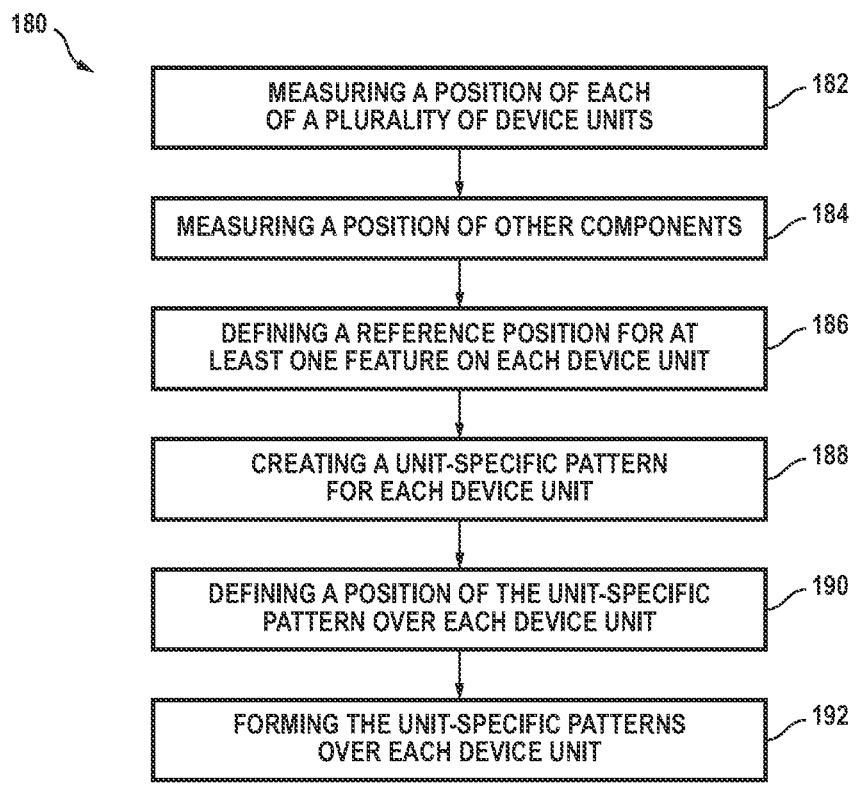
FIG. 8 illustrates a method diagram of an embodiment of an adaptive patterning method.

The method diagram provided in FIG. 8 illustrates a particular embodiment of an adaptive patterning method 180 comprising measuring a position of each of a plurality of device units of a panel (Step 182), defining a reference position of at least one feature on each of the plurality of device units, wherein the measured position has a different x-y position or orientation as compared to the reference position for the at least one of the plurality of device units (Step 186), creating, by a processor, a unit-specific pattern comprising at least one of a via pattern, a capture pad, and an interconnecting trace pattern, for each of the respective plurality of device units based upon the measured position for each of the respective device units (Step 188) by calculating a delta-value between the measured position and the reference position for each of the respective plurality of device units and adjusting a position of the unit-specific pattern by the same delta-value from the reference position of the unit-specific pattern for at least one of the plurality of device units, defining a position of the unit-specific pattern over each the respective device units, wherein the unit-specific pattern created has a different x-y position or orientation as compared to the reference position for each of the respective device units (Step 190), and forming the unit-specific patterns over each of the respective device units, wherein each unit-specific pattern is aligned with the respective device unit (Step 192). In particular implementations, creating the unit-specific pattern for each of the respective device units comprises creating a module-specific pattern for each of the respective plurality of device units based upon the measured position for each of the respective device units, and forming the unit-specific patterns over each of the plurality of device units comprises forming the module-specific patterns over each of the plurality of device units, wherein each module-specific pattern is aligned with the respective at least two device units within the respective module. In particular implementations, the method may optionally comprise measuring a position of each of a plurality of other components of the panel, the other components selected from the group consisting of optical elements, connectors and electronic components (Step 184). Methods may be implemented as non-transitory computer-readable storage medium having instructions stored thereon, which, when executed by a processor, cause the processor to perform an adaptive patterning method operation.

Figure 9:
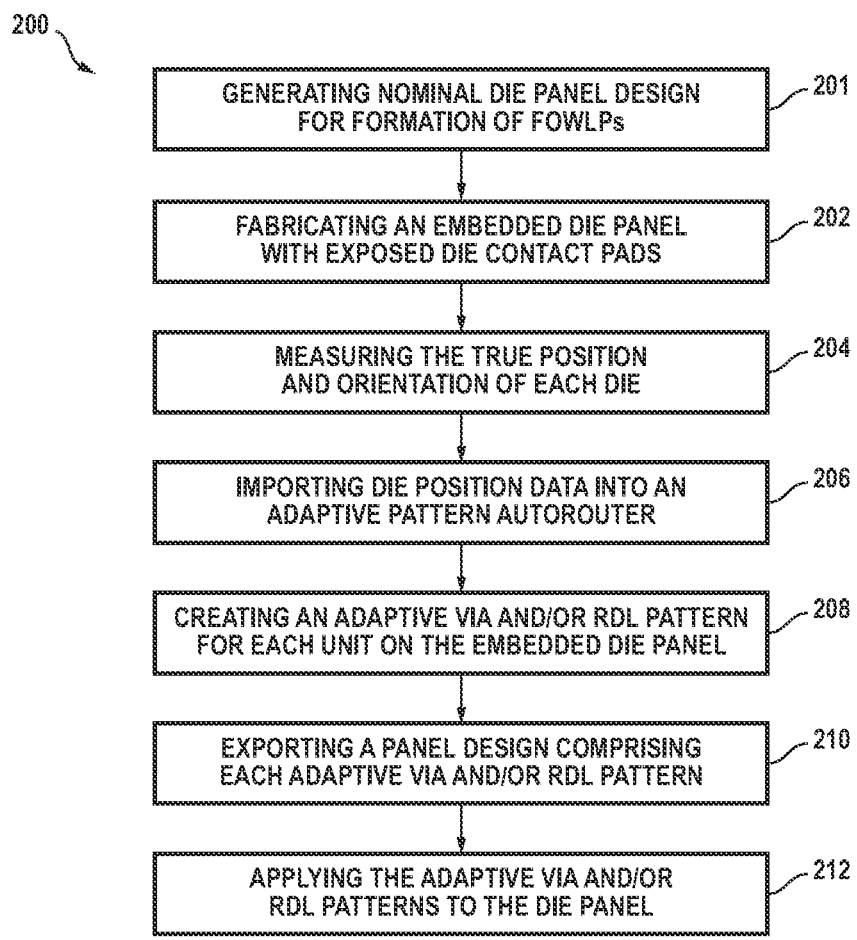
FIG. 9 illustrates a method diagram of an embodiment of an adaptive patterning method.

The method diagram provided in FIG. 9 illustrates a particular embodiment of an adaptive patterning method 200, comprising generating a nominal semiconductor die panel design for formation of FOWLPs (step 201), fabricating an embedded semiconductor die panel with exposed semiconductor die contact pads (step 202), measuring the true position and orientation of each semiconductor die within the embedded semiconductor die panel (step 204), importing semiconductor die position data into an adaptive pattern autorouter (step 206), creating an adaptive via and/or RDL pattern for each semiconductor die on the embedded semiconductor die panel (step 208), exporting a panel design comprising each adaptive via and/or RDL pattern (step 210), and applying the adaptive via and/or RDL patterns to the embedded semiconductor die panel (step 212). Methods may be implemented as non-transitory computer-readable storage medium having instructions stored thereon, which, when executed by a processor, cause the processor to perform an adaptive patterning method operation.

Figure 10A:
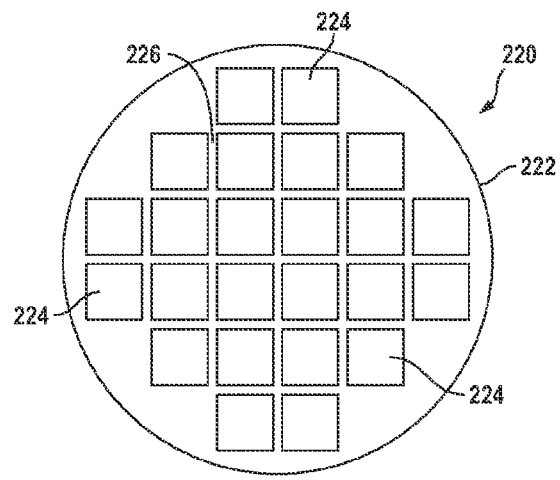
FIGS. 10A-10C illustrate a plurality of semiconductor die for use in a FOWLP in accordance with an embodiment of the disclosure.

FIG. 10A shows a semiconductor wafer 220 with a base substrate material 222, such as, without limitation, silicon, germanium, gallium arsenide, indium phosphide, or silicon carbide, for structural support. A plurality of semiconductor die or components 224 is formed on wafer 220 separated by a non-active, inter-die wafer area or saw street 226 as described above. Saw street 226 provides cutting areas to singulate semiconductor wafer 220 into individual semiconductor die 224.

Figure 10B:
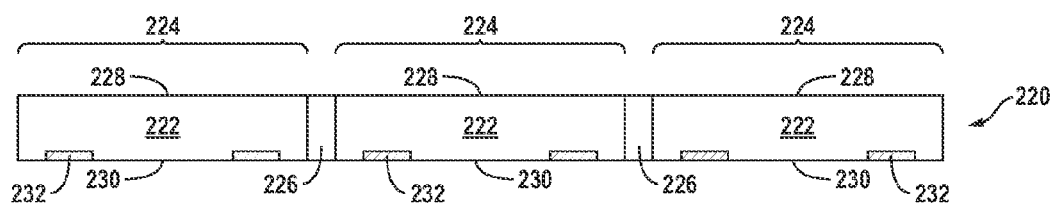

FIG. 10B shows a cross-sectional view of a portion of semiconductor wafer 220. Each semiconductor die 224 has a backside or back surface 228 and active surface 230 opposite the backside. Active surface 230 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 230 to implement analog circuits or digital circuits, such as DSP, ASIC, memory, or other signal processing circuit. Semiconductor die 224 may also contain integrated passive devices (IPDs), such as inductors, capacitors, and resistors, for RF signal processing. In an embodiment, semiconductor die 224 is a flipchip type device.

An electrically conductive layer 232 is formed over active surface 230 using PVD, CVD, electrolytic plating, electroless plating process, or other suitable metal deposition process. Conductive layer 232 can be one or more layers of Al, Cu, Sn, Ni, Au, Ag, or other suitable electrically conductive material. Conductive layer 232 operates as contact pads or bond pads electrically connected to the circuits on active surface 230. Conductive layer 232 can be formed as contact pads disposed side-by-side a first distance from the edge of semiconductor die 224, as shown in FIG. 10B. Alternatively, conductive layer 232 can be formed as contact pads that are offset in multiple rows such that a first row of contact pads is disposed a first distance from the edge of the die, and a second row of contact pads alternating with the first row is disposed a second distance from the edge of the die.

Figure 10C:
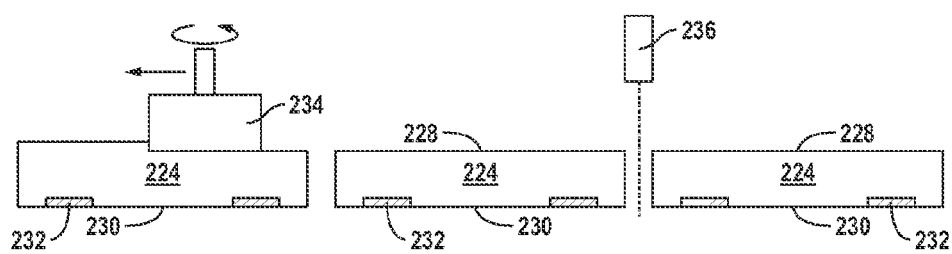

In FIG. 10C, semiconductor wafer 220 undergoes an optional grinding operation with grinder 234 to planarize the surface and reduce thickness of the semiconductor wafer. A chemical etch can also be used to remove and planarize semiconductor wafer 220. Semiconductor wafer 220 is singulated through saw street 226 using a saw blade or laser cutting tool 236 into individual semiconductor die 224.

Figure 11A:
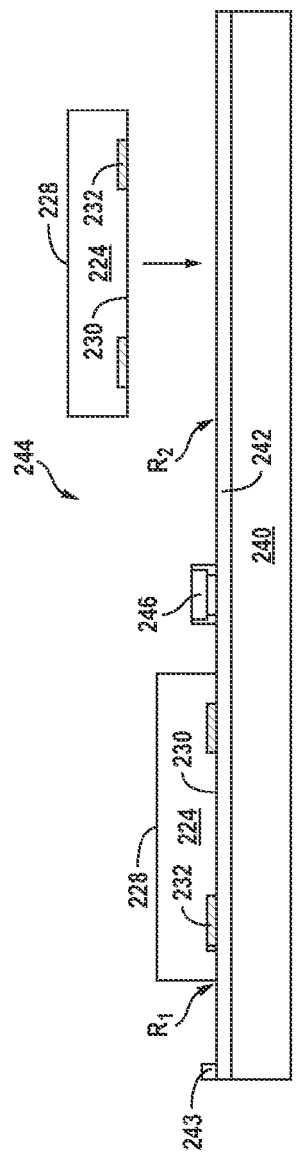

FIG. 11A shows a carrier or substrate 240 containing temporary or sacrificial base material such as silicon, polymer, beryllium oxide, or other suitable low-cost, rigid material for structural support. An optional interface layer or double-sided tape 242 is formed over carrier 240 as a temporary adhesive bonding film or etch-stop layer. In an embodiment, interface layer 242 is permanently affixed to semiconductor die 224 and forms a part of a final FOWLP as described in greater detail in US Pub. No. 2011/0198762, the disclosure of which is hereby incorporated herein by reference. A number of fiducial alignment marks 243 are positioned over or attached to substrate 240 or interface layer 242. Alternatively a portion of substrate 240 or interface layer 242 is removed or marked to form fiducial 243. Fiducial 243 allows for orientation and handling of substrate 240 with respect to the subsequent mounting of semiconductor die 224.

FIG. 11A further shows semiconductor die 224 from FIG. 10C mounted to carrier 240 and interface layer 242 with active surface 230 oriented towards the substrate. Semiconductor die 224 are positioned with respect to fiducial 243 according to a nominal or predetermined position and spacing for the semiconductor die. The nominal positions selected for each of semiconductor die 224 are determined as part of a nominal or predetermined panel design that facilitates the formation of FOWLPs for each semiconductor die 224. The nominal panel design provides adequate space for the formation of fan-out build-up interconnect structures for each semiconductor die 224 and singulation among the final FOWLPs. Accordingly, FIG. 11A shows a first semiconductor die 224 is mounted or disposed over substrate 240 at a point of reference R1, as measured from fiducial 243, that corresponds to the location of the first semiconductor die within the nominal panel design. Similarly, a second semiconductor die 224 is mounted or disposed over substrate 240 at a point of reference R2, as measured from one or more fiducials 243, that corresponds to the location of the second semiconductor die within the nominal panel design.

Semiconductor die 224 are separated by space or gap 244 when mounted over substrate 240. Gap 244 provides an area for a subsequently formed fan-out interconnect structure. A size of gap 244 is determined according to the nominal panel design and provides sufficient space for FOWLPs to be formed around each semiconductor die 224. Gap 244 is also includes sufficient area for optionally mounting semiconductor devices or components 246. Semiconductor devices 246 are mounted to interface layer 242 and carrier 240 between semiconductor die 224, and are positioned within gap 244 in such a way as to provide adequate space for the subsequent singulation of semiconductor 224 from a reconstituted wafer. Semiconductor devices 246 include discrete devices, distributed components, or passive devices similar to passive devices 156 shown in FIG. 1D including inductors, capacitors, and resistors.

Figure 11B:
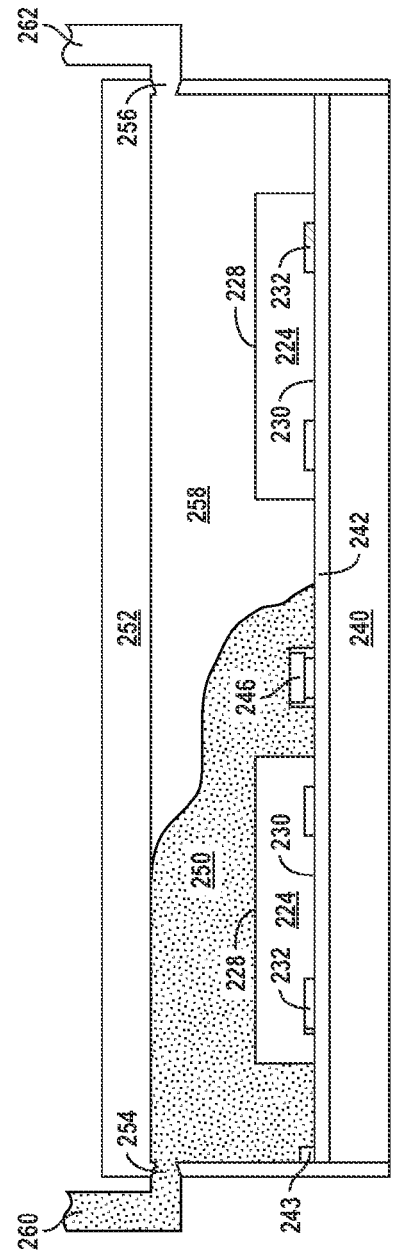

FIG. 11B shows an encapsulant 250 is deposited using a paste printing, compressive molding, transfer molding, liquid encapsulant molding, vacuum lamination, spin coating, or other suitable applicator. Specifically, FIG. 11B shows a mold 252 with a plurality of inlets 254 and 256 brought together with carrier 240 and interface layer 242 to enclose semiconductor die 224 within the mold for subsequent encapsulation. Mold 252 is brought together by moving mold 252 around semiconductor die 224, or alternatively, by moving the semiconductor die into the mold. Mold 252 includes only a first or top portion that is brought together with carrier 240 and interface layer 242 without a second or bottom mold portion. Carrier 240 and interface layer 242 serve as the bottom mold portion for the subsequent encapsulation process. Alternatively, semiconductor die 224, carrier 240, and interface layer 242 may be disposed within a mold including multiple portions, such as top and bottom portions.

FIG. 11B further shows mold 252 encloses semiconductor die 224 with a cavity or open space 258. Cavity 258 extends between mold 252 to semiconductor die 224 and interface layer 242. A volume of encapsulant 250 is injected from dispenser 260 under an elevated temperature and pressure through inlet 254 into cavity 258 and over semiconductor die 224 and carrier 240. Inlet 256 can be an exhaust port with optional vacuum assist 262 for excess encapsulant 250.

Encapsulant 250 can be a polymer composite material, such as epoxy resin with filler, epoxy acrylate with filler, or polymer with proper filler. The volume of encapsulant 250 is measured according to the space requirements of cavity 258 less the area occupied by semiconductor die 224 and semiconductor devices 246. Encapsulant 250 is evenly dispersed and uniformly distributed under an elevated temperature within cavity 258 around semiconductor die 224. A viscosity of encapsulant 250 is selected for uniform coverage, for example, a lower viscosity increases the flow of the encapsulant for molding, paste printing, and spin coating. Semiconductor die 224 are embedded together in encapsulant 250 which is non-conductive and environmentally protects the semiconductor device from external elements and contaminants.

In FIG. 11C, semiconductor die 224 are removed from mold 252. Carrier 240 and interface layer 242 are removed by chemical etching, mechanical peeling, CMP, mechanical grinding, thermal bake, UV light, laser scanning, or wet stripping to expose surface 266 of encapsulant 250 opposite surface 268. Surface 266 of encapsulant 250 is substantially coplanar with active surface 230 and contact pads 232 of semiconductor die 224, each of which is exposed by the removal of carrier 240 and interface layer 242. Thus, the process described above with respect to FIGS. 10A-10C and FIGS. 11A-11C provides additional detail for process step 202 shown in FIG. 9. After removal of carrier 240 and interface layer 242, FIG. 11C shows encapsulant 250 disposed around semiconductor die 224 to form embedded die panel 270. Panel 270 includes a footprint or form factor of any shape and size that allows for, and facilitates, the subsequent processing required to form FOWLPs as described in greater detail below. In an embodiment, panel 270 includes a form factor similar to the form factor of a 300 millimeters (mm) semiconductor wafer and includes a circular footprint having a diameter of 300 mm.

FIG. 11C further shows scanner 274 inspecting panel 270 to determine a true or actual position of semiconductor die 224 within panel 270. Scanner 274 uses optical imaging, acoustic imaging, magnetic imaging, radiofrequencies, infrared, or other suitable process to determine a true or actual position of semiconductor die 224, or a true or actual position of other object including optional semiconductor devices 246 within panel 270. The true position and rotation of each semiconductor die 224 or other object is determined with respect to a global point of reference R3 on panel 270. Point of reference R3 includes a number of fiducials 243 transferred from substrate 240 with the formation of encapsulant 250 and the removal of substrate 240 and interface layer 242. Point of reference R3 further includes a number of new fiducial alignment marks that are positioned over or attached to panel 270, or are formed by marking or removing a portion of encapsulant 250. Alternatively, point of reference R3 is not physically identified as part of panel 270, but instead is associated with a portion of scanner 274 or an attachment point to scanner 274.

Scanner 274 inspects features on each semiconductor die 224 to determine actual position and rotation of every semiconductor die in panel 270 with respect to point of reference R3. The features identified by scanner 274 on each semiconductor die 224 include a location of an edge or corner of the semiconductor die, a position of contact pad 232 including a corner, center, or outline of the contact pad, or any other feature on or associated with the semiconductor die. The actual or measured position of semiconductor die 224 includes an x-y position that accounts for a lateral or translational shift in one or more directions of the semiconductor die with respect to a point of reference R3 within panel 270. Similarly, the actual or measured position of semiconductor die 224 also includes an orientation or angular rotation with respect to point of reference R3.

As illustrated in FIG. 11C, first semiconductor die 224 is encapsulated within panel 270 and is located at point of reference R4, which is measured with respect to point of reference R3. Similarly, second semiconductor die 224 is encapsulated within panel 270 at a point of reference R5, which is measured with respect to point or reference R3. When semiconductor die 224 are precisely and accurately placed at points of reference R1 and R2, and the semiconductor die do not undergo any movement or shifting during encapsulation, R1 and R2 are equal to R4 and R5, respectively. However, movement of semiconductor die 124 from the nominal position of the predetermined panel design results in points of reference R4 and R5 being different from points of reference R1 and R2, respectively. Movement of semiconductor die 224 away from their nominal positions and point of reference R3 results from inaccuracies in mounting the semiconductor die over substrate 240. Additionally, movement of semiconductor die 124 also results from shifts in the position of the semiconductor die which occur during encapsulation. For example, a force resulting from encapsulant 250 contacting semiconductor die 224 can cause semiconductor die 224 to shift with respect to point of reference R3 and shift with respect to the nominal position of the semiconductor die within the predetermined panel design, that is, points of reference R1 and R2. Thus, the process described above with respect to FIG. 11C provides additional detail for process step 204 shown in FIG. 9.

As indicated in step 206 in FIG. 9, after the true position and orientation of each semiconductor die 224 within panel 270 is determined by scanner 274, the true positions of the semiconductor die, for example, R4 and R5, are compared to the nominal positions of the semiconductor die within the nominal panel design, see for example R1 and R2 and step 201 in FIG. 9, to determine the change of position or shift of each semiconductor die 224 that occurred during processing. By ascertaining the difference in position between the nominal or original design position of semiconductor die 224 and the actual position of the semiconductor die, potential problems with the subsequent formation of a fan-out build-up interconnect structure over the semiconductor can be identified and averted. A potential problem exists if a true position of a semiconductor die 224, for example, R4 and R5, has shifted such that the true position of a contact pad 232 on the semiconductor die will no longer align or provide a good electrical connection with the subsequently formed fan-out build-up interconnect structure. The fan-out build-up interconnect structure as originally designed for panel 270 will not align with some semiconductor die 224 because the build-up interconnect structure as originally designed is based on the nominal positions of the semiconductor die within the panel design, for example, R1 and R2, and not the actual or true position of the semiconductor die 224 after having been formed as part of panel 270, for example, R4 and R5. Accordingly, at least a portion of the original design of the fan-out build-up interconnect structure is modified before being applied to panel 270 to avoid the problems of misalignment and inadequate electrical connections between the interconnect structure and semiconductor die 224. In an embodiment, position data for semiconductor die 224 is imported into an adaptive pattern auto-router, which is shown as part of adaptive patterning system 160 in step 166 of FIG. 7. Thus, adaptive patterning system 160 accounts for the true or measured positions of semiconductor die 224 and produces a new design that adjusts or selects new locations for at least a portion of the fan-out build-up interconnect structure, for example, vias, RDLs, pads, and traces, to connect to contact pads 232 of semiconductor die 224. See also step 208 in FIG. 9 and steps 168 and 170 in FIG. 7. Individual package designs are combined to form a drawing of the full panel for each of the layers that need to be adjusted. See, for example, step 210 in FIG. 9. The difference in shift from nominal to true positions dictates how the individual package designs are combined to form the full panel design. In an embodiment, design files for each panel are imported to a lithography machine that uses the design data to dynamically apply a custom, adaptive pattern to each panel. See, for example, step 212 in FIG. 9.

In FIG. 11D, a first portion of a fan-out build-up interconnect structure is formed over panel 270 by the deposition and patterning of insulation or passivation layer 280. Alternatively, as indicated above, interface layer 242 remains attached to panel 270 after the removal of substrate 240 to serve as the first portion of the fan-out build-up interconnect structure and become part of the final FOWLP. Insulating layer 280 is conformally applied to, and has a first surface that follows the contours of, encapsulant 250 and semiconductor die 224. Insulating layer 280 has a second planar surface opposite the first surface. Insulating layer 280 contains one or more layers of photosensitive low curing temperature dielectric resist, photosensitive composite resist, laminate compound film, insulation paste with filler, solder mask resist film, liquid molding compound, silicon dioxide (SiO2), silicon nitride (Si3N4), silicon oxynitride (SiON), aluminum oxide (Al2O3), or other material having similar insulating and structural properties. Insulating layer 280 is deposited using printing, spin coating, spray coating, lamination, or other suitable process. Insulating layer 280 is subsequently patterned and optionally cured.

A portion of insulating layer 280 is removed by etching, laser drilling, mechanical drilling, or other suitable process to form openings 282. Openings 282 extend completely through insulating layer 280 and expose contact pads 232 of semiconductor die 224. When changes in the positions of semiconductor die 224 are small with respect to point of reference R3, no adjustments to the positions of openings 282 may be required to properly align the openings with contact pads 232. Thus, the adaptive patterning for packaging semiconductor die 224 includes measuring the true position of semiconductor die 224, and determining whether the shifts or movement of the semiconductor die require changes to the positions of openings 282. If the changes in position of contact pads 232 are such that the nominal position of openings 282 do not provide sufficient contact with the contact pads, then adjustments to the position of openings 282 will be made.

Adaptive patterning can adjust the position of each opening 282 individually, or adjust positions of a number of openings 282 simultaneously. For example, a number of openings 282 form a unit pattern that relates to a single semiconductor die 224 within panel 270, which are adjusted together as a unit. The positions of openings 282 are adjusted, either individually or in groups, by an x-y translation or by rotation of an angle θ with respect to point of reference R3 on panel 270. For example, a first portion of openings 282, designated as openings 282a in FIG. 11D, is adjusted by an x-y translation or by rotation of an angle θ according to the true position of semiconductor die 224a within panel 270 as measured with respect to point of reference R3. Similarly, a second portion of openings 282, designated as openings 282b in FIG. 11D, is adjusted by an x-y translation or by rotation of an angle θ according to the true position of semiconductor die 224b within panel 270 as measured with respect to point of reference R3. The adaptive patterning of openings 282 occurs, as needed, for each semiconductor die 224 within panel 270. In an embodiment, openings 282 are formed using a proprietary design tool that modifies or adjusts the fan-out unit design for each package on the panel so that conductive vias subsequently formed in openings 282 are properly aligned to contact pads 232. When changes in the positions of openings 282 are small with respect to point of reference R3, no additional adjustments to the build-up interconnect structure may be required. Alternatively, the nominal positions of other portions of the build-up interconnect layer are changed in addition to changing a position of openings 282, as described in greater detail below.

In FIG. 11E, an electrically conductive layer is deposited in openings 282 using PVD, CVD, electrolytic plating, electroless plating, or other suitable process to form conductive vias 288. Conductive vias 288 can be one or more layers of Al, Cu, Sn, Ni, Au, Ag, titanium (Ti), tungsten (W), poly-silicon, or other suitable electrically conductive material. Conductive vias 288 form part of the build-up interconnect structure and provides vertical electrical connection with contact pads 232.

Figure 11F:
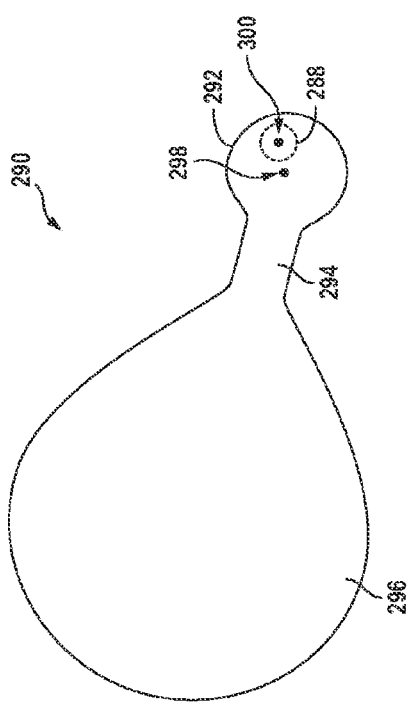

FIG. 11E also shows an electrically conductive layer 290 is patterned and deposited over insulating layer 280 and conductive layer 288. Conductive layer 290 can be one or more layers of Al, Cu, Sn, Ni, Au, Ag, or other suitable electrically conductive material. The deposition of conductive layer 290 uses PVD, CVD, electrolytic plating, electroless plating, or other suitable process. In an embodiment, conductive layer 290 is formed together with conductive layer 288 at a same time. Alternatively, conductive layers 288 and 290 are formed as part of separate processes and at different times. Conductive layer 290 can be formed in a manner similar to RDL 114 shown in FIG. 2B and FIG. 4. FIG. 11F is a plan view of a portion of conductive layer 290 that includes a first via capture pad 292, a trace 294, and a second via capture pad 296. The first via capture pad 292, is similar to first via capture pad 118, and is disposed over insulating layer 280 and conductive via 288. Conductive layer 290 also includes trace 294, similar to trace portion 122, that is formed over insulating layer 280 and extends from first via capture pad 292 to second via capture pad 296, which is similar to UBM via capture pad 120. Second via capture pad 296 contacts trace portion 294 of conductive layer 290 and is opposite first via capture pad 292. In an embodiment, trace 294 includes a width less than a width of the first and second via capture pads 292 and 296, respectively.

As indicated above, when changes in the positions of semiconductor die 224, openings 282, and conductive vias 288 are small with respect to point of reference R3, no additional adjustments to the build-up interconnect structure, including to conductive layer 290, may be required. Thus, the adaptive patterning for the packaging of semiconductor die 224 formed in panel 270 includes measuring the true position of semiconductor die 224, determining that the shifts or movement of the semiconductor die do not require changes to the pattern or design of conductive layer 290, and forming conductive layer 290 at a location previously determined with respect to panel 270 and point of reference R3, that is, without making adjustments for changes in position of semiconductor die 224 with respect to point of reference R3. Alternatively, if the changes in position of openings 282 are such that the nominal position of first via capture pad 292 does not provide sufficient contact with conductive via 288, then adjustments to conductive layer 290 will be made.

In a particular embodiment, an area or footprint of first via capture pads 292 is enlarged such that they are disposed over conductive vias 288, thereby accommodating shifts in the position of conductive vias 288 with respect to a static RDL pattern. In other words, the position of conductive layer 290 is formed according to the nominal or planned position with respect to point of reference R3 without making translational or rotational shifts to the pattern or lay out of conductive layer 290. Adjusting for the true position of conductive vias 288 by increasing an area of first via capture pad 292 means a position of a geometric center 298 of first via capture pad 292 is formed with respect to a point of reference R3 and is not dependent upon the measured location of conductive vias 288 or a geometric center 300 of conductive vias 288. Accordingly, in some cases center 298 of first via capture pad 292 will be offset from center 300 of vias 288. However, the increased size of first via capture pads 292 provide sufficient area to contact an entirety of a surface of conductive via 288 and provide a good electrical connection between the conductive via and first via capture pad. The approach of increasing a size or area of capture pad 292 is useful in applications using larger pad pitches. Larger pad pitch applications have sufficient space between adjacent via capture pads 292 such that after the increase in area of the first via capture pads, an adequate space or gap exists between the enlarged pads to prevent contact, bridging, or short circuiting among the pads. Enlarging an area of first via capture pads 292 without adjusting the location of the centers 298 of the pads is not suitable for applications with fine pad pitch that would result in contact, bridging, or short circuiting among the first via pads.

In another embodiment, adaptive patterning of conductive layer 290 does not require increasing a size of first and second via capture pads 292 and 296. Instead, the size, spacing, and design of conductive layer 290, including the size of first and second contact pads 292 and 296, remains constant and is formed according to the original or nominal design of conductive layer 290, which was determined before measuring the shift of semiconductor die 224. The size, spacing, and design of conductive layer 290 is adaptively patterned for each true position of semiconductor die 224 by shifting an entirety of conductive layer 290 associated with each semiconductor die 224 by an x-y translation or a rotation of an angle θ with respect to point of reference R3 to adjust for the true position of semiconductor die 224. The adaptive patterning of conductive layer 290 occurs together with conductive via 288 for each semiconductor die 224, as needed within panel 270. For example, a first portion of conductive layer 290, designated as conductive layer 290a in FIG. 11E, is adjusted by an x-y translation or a rotation of an angle θ according to the true position of semiconductor die 224a within panel 270 as measured with respect to point of reference R3. Similarly, a second portion of conductive layer 290, designated as conductive layer 290b in FIG. 11E, is adjusted by an x-y translation or a rotation of an angle θ according to the true position of semiconductor die 224b within panel 270 as measured with respect to point of reference R3. Thus, by adjusting the position of the conductive layer 290 for each semiconductor die 224, conductive layer 290 aligns with the true or actual position of semiconductor die 224 within panel 270. Furthermore, a good connection between contact pad 232, conductive via 288, and conductive layer 290 is provided for without increasing an area of via capture pads, and as such is suitable for fine pitch applications.

As a result of shifting the orientation or location of conductive layer 290 for each semiconductor die 224, the offset created by the differences between the nominal and true positions of semiconductor die 224 with respect to an outer edge of a completed FOWLP is transferred or shifted to an interface or interconnection between second via capture pad 296 and a subsequently formed interconnect such as a second via, a UBM, or another suitable interconnect structure. Desirably, the position of the UBM pattern or other suitable interconnect structure is held constant and does not shift with respect to the edge of the package. Therefore, if the entire RDL pattern or conductive layer 290 shifts with respect to the fixed UBM or interconnect structure pattern, the shift of conductive layer 290 can be accommodated either by increasing the size of the underlying capture pad on the RDL layer or by reducing the diameter of the via connecting the UBM to the RDL layer. However, shifting the orientation or location of conductive layer 290 for each semiconductor die 224 is not well suited for multichip modules in which multiple semiconductor die or components shift with respect to each other within the same unit design and include different rotations and/or x-y translations with respect to panel 270 and point of reference R3. For a FOWLP that has only a single RDL, fan-in, or fan-out routing layer, the overlay problem and alignment of layers within the build-up interconnect structure is moved to the next via layer underlying the UBM. Advantageously, build-up interconnect structures with multiple RDLs can shift the overlay problem to additional RDL layers or areas within the package having larger pitches and less stringent spacing requirements, thereby more easily adapting to shifts in the positions of semiconductor die 224.

As discussed above, different approaches for adjusting a position of conductive layer 290 to align with the true or actual position of semiconductor die 224 within panel 270 can be used. In a preferred embodiment, each unit-specific pattern of conductive layer 290 associated with each semiconductor die 224 can be uniquely and individually designed based on the locations of semiconductor die 224 and based on the locations of a final interconnect structure for each FOWLP, such as a location of conductive bumps. Increased flexibility for matching a position of conductive layer 290 to each semiconductor die 224 and to a location of the final interconnect structure can be achieved by calculating a unique or complete custom RDL pattern for conductive layer 290 and for each semiconductor die 224 within panel 270. This method has the potential to address both the connection between semiconductor die 224, conductive layer 290, and a subsequently formed final interconnect structure or UBM without compromising on overlay design rules. When creating a complete custom RDL layer or design for the location of conductive layer 290, algorithms used to determine a full design for each semiconductor die 224 within panel 270 can become complex and may increase a difficulty of reliably replicating conductive layer 290. Complexity of conductive layer 290 is increased with the formation of complete custom RDL patterns and by patterns comprising features such as inductors, large power planes, and large ground planes.

Another approach for adjusting a position of conductive layer 290 in order to align with the true or actual position of semiconductor die 224 within panel 270 includes generating a discrete number of fixed generic patterns during the initial design process. Each generic pattern is applicable to a subset of the possible die shifts defined by the process capability of the panelization process. Accordingly, based on the true or measured position for each of semiconductor die 224 within panel 270, a "best fit" pattern can be selected from the discrete number of fixed generic patterns and matched to a particular semiconductor die within the panel. See for example FIG. 6 and related text. In this manner, best-fit patterns for each semiconductor die 224 within panel 270 can be based upon the measured rotation and/or x-y translation (the delta-value) for each semiconductor die 224 without calculating a unique or custom RDL pattern for each semiconductor die.

Figure 11G:
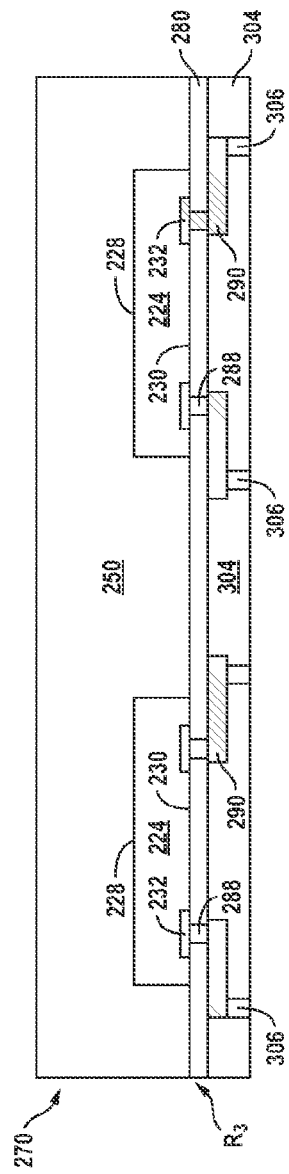

FIG. 11G, continuing from FIGS. 11E and 11F, shows a cross sectional view of an insulating or passivation layer 304 that is conformally applied to, and has a first surface that follows the contours of, insulating layer 280 and conductive layer 290. Insulating layer 304 has a second planar surface opposite the first surface. Insulating layer 304 contains one or more layers of photosensitive low curing temperature dielectric resist, photosensitive composite resist, laminate compound film, insulation paste with filler, solder mask resist film, liquid molding compound, SiO2, Si3N4, SiON, Al2O3, or other material having similar insulating and structural properties. Insulating layer 304 is deposited using printing, spin coating, spray coating, lamination, or other suitable process. Insulating layer 304 is subsequently patterned and optionally cured.

A portion of insulating layer 304 is removed by etching, laser drilling, mechanical drilling, or other suitable process to form openings that extend completely through insulating layer 304 and expose a portion of conductive layer 290, such as second via capture pad 296. An electrically conductive layer is deposited in the openings in insulating layer 304 using PVD, CVD, electrolytic plating, electroless plating, or other suitable process to form conductive vias 306. Conductive vias 306 can be one or more layers of Al, Cu, Sn, Ni, Au, Ag, Ti, W, poly-silicon, or other suitable electrically conductive material. Conductive vias 306 form part of a build-up interconnect structure and provide vertical electrical connection with respect to contact pads 232, conductive vias 288, and conductive layer 290.

In an embodiment, a position of conductive via 306 is formed at its nominal position with respect to point of reference R3 and panel 270 and aligns with second via capture pads 296. Conductive vias 306 can align with second via capture pads 296 because the shift in semiconductor die 224 and conductive layer 290 is small with respect to point of reference R3 and panel 270 or because although conductive layer 290 shifts to match semiconductor die 224, via capture pad 296 is enlarged so that conductive vias 306 make good electrical contact with second via capture pad 296. Alternatively, the position of conductive vias 306 can be adaptively adjusted from its nominal location to match a new or true position of conductive layer 290 and second via capture pad 296. Adaptive patterning of conductive vias 306 can also include adjusting or reducing a diameter of the conductive via, thereby ensuring a good and complete connection between conductive via 306 to conductive layer 290 and to a subsequently formed UBM layer or interconnect structure. A reduced diameter of conductive via 306 allows for more movement of a position of conductive layer 290 and second via capture pad 296 while ensuring a footprint of conductive via 306 is completely within a footprint of conductive layer 290 or second via capture pad 296.

Figure 11H:
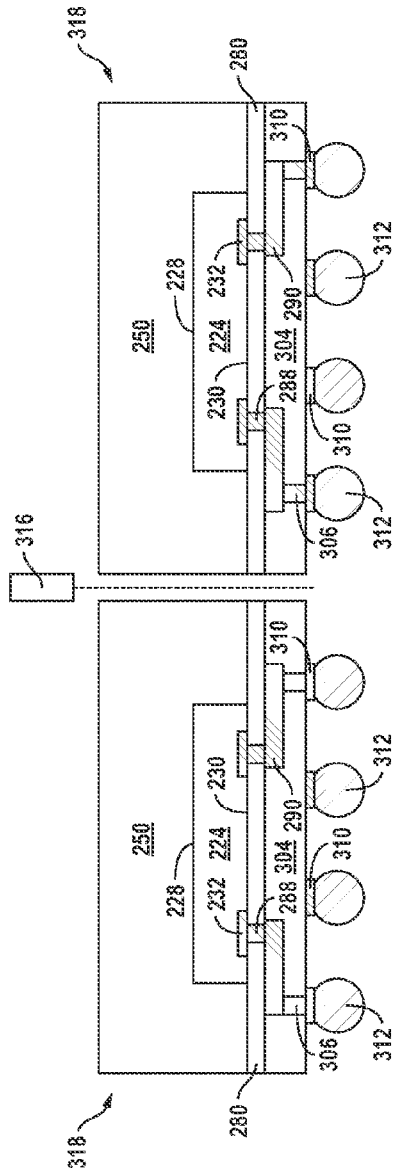

FIG. 11H shows UBMs 310, similar to UBM pads 119 in FIG. 2B, formed over conductive vias 306 and insulating layer 304. UBMs 310 can be multiple metal stacks including adhesion, barrier, seed, and wetting layers. Layers of UBM 310 can be Ti, titanium nitride (TiN), TiW, Al, Cu, chromium (Cr), chromium copper (CrCu), Ni, nickel vanadium (NiV), Pd, platinum (Pt), Au, and Ag. In an embodiment, UBMs 310 comprise a TiW seed layer, a Cu Seed layer, and a Cu UBM layer. The TiW seed layer is conformally applied over insulating layer 304 and conductive vias 306. The Cu seed layer is conformally applied over the TiW seed layer. The Cu UBM layer is conformally applied over the TiW seed layer and the Cu seed layer. UBMs 310 act as an intermediate conductive layer between conductive vias 306 and subsequently formed solder bumps or other I/O interconnect structures. UBMs 310 can provide a low resistive interconnect to conductive vias 306, a barrier to solder diffusion, and an increase in solder wettability.

An electrically conductive bump material is deposited over UBMs 310 and conductive vias 306 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBMs 310 using a suitable attachment or bonding process. In an embodiment, the bump material is reflowed by heating the material above its melting point to form spherical balls or bumps 312. In some applications, bumps 312 are reflowed a second time to improve electrical contact to UBMs 310. The bumps can also be compression bonded to UBMs 310. Bumps 312 represent one type of interconnect structure that can be formed over UBMs 310. The interconnect structure can also use conductive paste, stud bump, micro bump, or other electrical interconnect.

FIG. 11H also shows that after the formation of bumps 312, panel or reconstituted wafer 270 is singulated using a saw blade or laser cutting tool 316 to form individual FOWLPs 318. Because bumps 312 are not adaptively adjusted for movement of semiconductor die 224 within panel 270 and are formed in accordance with their nominal design positions (see, for example, step 201 in FIG. 9), bumps 312 are aligned with a periphery or an outer package profile of FOWLPs 318.

Accordingly, FIGS. 11A-11H show a method of making FOWLPs 318, wherein the first via layer and at least a portion of the RDL routing layer is shifted from its nominal position on the wafer to align with the true position of each semiconductor die. By so doing, at least the package I/O interconnects maintain alignment with the edge of the finished package to comply with a package outline drawing, facilitate package testing, and eliminate yield loss caused by misalignment of semiconductor die during panelization. Implementation of adaptive patterning can use programmable direct write exposure and laser ablation methods to allow for the adjustment of the position and orientation of vias and RDL layers to align with each individual semiconductor die within panel 270. In addition to increasing yield, the proposed process corrects for movement of die during cure and therefore enables smaller die bond pad geometry and increased densities.

Figure 12A:
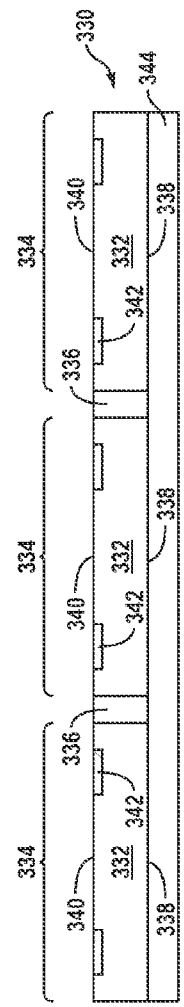
FIGS. 12A-12C illustrate a plurality of semiconductor die for use in a FOWLP in accordance with an embodiment of the disclosure.

FIG. 12A shows a cross-sectional view of a portion of semiconductor wafer 330 similar to semiconductor wafer 220 from FIG. 11A. Semiconductor wafer 330 includes a base substrate material 332, such as silicon, germanium, gallium arsenide, indium phosphide, or silicon carbide, for structural support. A plurality of semiconductor die or components 334 is formed on wafer 330 separated by a non-active, inter-die wafer area or saw street 336 as described above. Saw street 336 provides cutting areas to singulate semiconductor wafer 330 into individual semiconductor die 334. Semiconductor die 334 are disposed across semiconductor wafer 330 similar to semiconductor die 224 shown in FIG. 10A and similar to device units 104 shown in FIG. 1A.

FIG. 12A further shows each semiconductor die 334 has a backside or back surface 338 and an active surface 340 opposite the backside. Active surface 340 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 340 to implement analog circuits or digital circuits, such as DSP, ASIC, memory, or other signal processing circuit. Semiconductor die 334 may also contain IPDs such as inductors, capacitors, and resistors, for RF signal processing.

An electrically conductive layer 342 is formed over active surface 340 using PVD, CVD, electrolytic plating, electroless plating process, or other suitable metal deposition process. Conductive layer 342 can be one or more layers of Al, Cu, Sn, Ni, Au, Ag, or other suitable electrically conductive material. Conductive layer 342 operates as contact pads or bond pads electrically connected to the circuits on active surface 340. Conductive layer 342 can be formed as contact pads disposed side-by-side a first distance from the edge of semiconductor die 334, as shown in FIG. 12A. Alternatively, conductive layer 342 can be formed as contact pads that are offset in multiple rows such that a first row of contact pads is disposed a first distance from the edge of the die, and a second row of contact pads alternating with the first row is disposed a second distance from the edge of the die.

Semiconductor wafer 330 can also undergo an optional grinding operation to planarize the backside surface and reduce a thickness of the semiconductor wafer. Similarly, an optional chemical etch can also be used to remove and planarize semiconductor wafer 330. With wafer 330 comprising a desired thickness, an optional backside coating 344 is formed over backside 338 of semiconductor die 334. Backside coating 344 is a polymer layer, dielectric film, epoxy film, or other suitable material having similar insulating and structural properties that can contain one or more layers of SiO2, Si3N4, SiON, tantalum pentoxide (Ta2O5), Al2O3, polyimide, benzocyclobutene (BCB), and polybenzoxazoles (PBO). Backside coating 344 can be formed by a lamination process, molding process, or other suitable process. Alternatively, optional backside coating 344 is omitted such that backside 338 remains exposed as part of a final package or remains exposed for subsequent encapsulation. In another embodiment, backside coating 344 is one or more layers of a thermally conductive material such as Al, Cu, Ni, Cu and Ni, or other suitable material with high thermal conductivity that is formed by a process such as printing, PVD, CVD, sputtering, electrolytic plating, electroless plating, metal evaporation, metal sputtering, or other suitable process. Thermally conductive backside coating 344 forms a thermally conductive path that aids with distribution and dissipation of heat generated by semiconductor die 332 and increases the thermal performance of the subsequently formed FOWLP. While backside coating 344 is shown in FIG. 12A as being formed on backside 338 of semiconductor wafer 330 before the wafer is singulated into individual semiconductor die, backside coating 344 can also be formed on individual semiconductor die 334 after singulation.

Figure 12B:
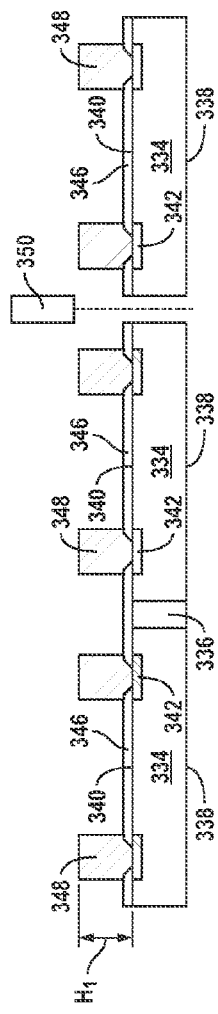

FIG. 12B shows semiconductor wafer 330 without optional backside coating 344, although the processes and structures shown in subsequent FIGs. can also be performed with backside coating 344 being present. FIG. 12B also shows an insulating or passivation layer 346 conformally applied over active surface 340 and over conductive layer 342. Insulating layer 346 includes one or more layers that are applied using PVD, CVD, screen printing, spin coating, spray coating, sintering, or thermal oxidation. Insulating layer 346 contains one or more layers of SiO2, Si3N4, SiON, Ta2O5, Al2O3, polyimide, BCB, PBO or other material having similar insulating and structural properties. In an embodiment, passivation layer 346 includes a passivation layer formed over active surface 340 and an optional polymer layer formed over the passivation layer and over conductive layer 342. Openings are formed completely through insulating layer 346 to expose at least a portion of conductive layer 342 for subsequent electrical connection. Alternatively, because insulating layer 346 is optional, conductive layer 342 is exposed for subsequent electrical interconnection in the absence of forming the insulating layer.

Electrical interconnects or copper posts, pillars, or columns 348 are formed over, and connected to, conductive layer 342. Interconnects 348 can be formed directly on conductive layer 342 using patterning and metal deposition processes such as printing, PVD, CVD, sputtering, electrolytic plating, electroless plating, metal evaporation, metal sputtering, or other suitable metal deposition process. Electrical interconnects 348 can be one or more layers of Al, Cu, Sn, Ni, Au, Ag, palladium (Pd), or other suitable electrically conductive material and can include one or more UBM layers. In an embodiment, a photoresist layer is deposited over semiconductor die 334 and conductive layer 342. A portion of the photoresist layer is exposed and removed by an etching development process. Electrical interconnects 348 are formed as copper pillars, posts, or columns in the removed portion of the photoresist and over conductive layer 342 using a selective plating process. The photoresist layer is removed leaving interconnects 348 that provide for subsequent electrical interconnection and a standoff with respect to active surface 340 and insulating layer 346, if present. Preferably, interconnects 348 include a height H1 in a range of 10-40 micrometers (μm). More preferably, interconnects 348 include a height in a range of 15-25 μm. Most preferably, interconnects 348 include a height of about 20 μm.

After the formation of interconnects 348, semiconductor wafer 330 is singulated through saw street 336 using a saw blade or laser cutting tool 350 into individual semiconductor die 334.

Figure 12C:
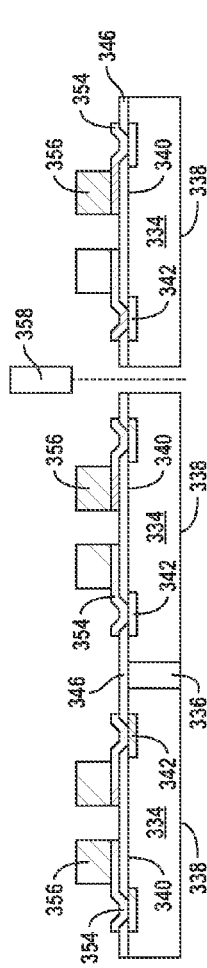

FIG. 12C shows semiconductor wafer 330 without optional backside coating 344, and with optional insulating or passivation layer 346, similar to FIG. 12B. FIG. 12C differs from FIG. 12B by the addition of conductive layer 354. Electrically conductive layer or RDL 354 is formed over insulating layer 346 and conductive layer 342 using a patterning and metal deposition process such as printing, PVD, CVD, sputtering, electrolytic plating, electroless plating, metal evaporation, metal sputtering, or other suitable metal deposition process. Conductive layer 354 can be one or more layers of Al, Cu, Sn, Ni, Au, Ag, or other suitable electrically conductive material. In an embodiment, conductive layer 354 is an RDL comprising a titanium tungsten (TiW) seed layer, a Cu seed layer, and Cu layer formed over the TiW seed layer and the Cu seed layer. Conductive layer 354 follows the contours of conductive layer 342 and insulating layer 346 or semiconductor die 334. Conductive layer 354 provides electrical paths between portions of conductive layer 342 and electrical interconnects or copper posts, pillars, or columns 356. Portions of conductive layer 354 can be electrically common or electrically isolated depending on the design and function of the later mounted semiconductor die. Conductive layer 354 operates as a fan-in RDL that provides additional flexibility in determining a position of electrical interconnects 356.

FIG. 12C also shows electrical interconnects or copper pillars, posts, or columns 356, which are similar to interconnects 348 described above in relation to FIG. 12B. Interconnects 356 differ from interconnects 348 by being formed over, and directly connected to, conductive layer 354 rather than conductive layer 342. After the formation of interconnects 356, semiconductor wafer 330 is singulated through saw street 336 using a saw blade or laser cutting tool 358 into individual semiconductor die 334.

Figure 13A:
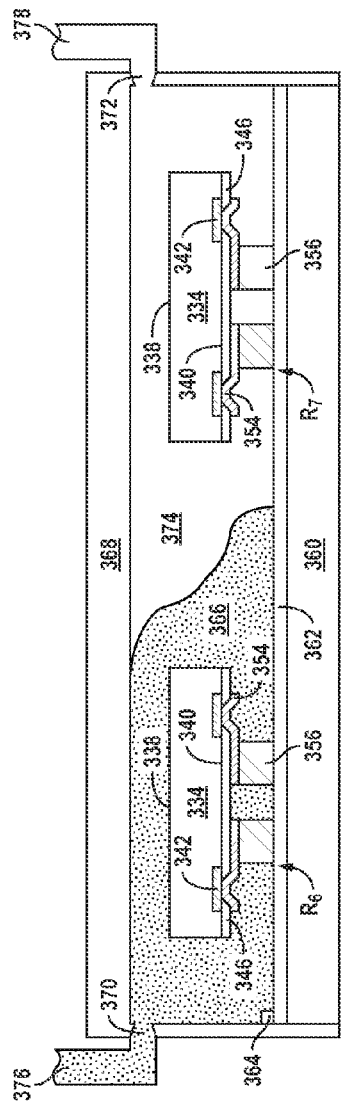

FIG. 13A shows a carrier or substrate 360 containing temporary or sacrificial base material such as silicon, polymer, beryllium oxide, or other suitable low-cost, rigid material for structural support. An optional interface layer or double-sided tape 362 is formed over carrier 360 as a temporary adhesive bonding film or etch-stop layer. A number of fiducial alignment marks 364 are positioned over or attached to carrier 360 or interface layer 362. Alternatively a portion of carrier 360 or interface layer 362 is removed or marked to form fiducial 364. Fiducial 364 allows for orientation and handling of carrier 360 with respect to the subsequent mounting of semiconductor die 334.

FIG. 13A further shows semiconductor die 334 from FIG. 12C mounted face down to carrier 360 and interface layer 362 with active surface 340 oriented towards the substrate. Alternatively, semiconductor die 334 from FIG. 12B can also be mounted face down to carrier 360 and interface layer 362 and undergo the processing described with respect to FIGS. 13A to 13H. Semiconductor die 334 are positioned with respect to fiducial 364 according to a nominal or predetermined position and spacing for the semiconductor die. The nominal positions selected for each of semiconductor die 334 are determined as part of a nominal or predetermined panel design that facilitates the formation of FOWLPs for each semiconductor die 334. The nominal panel design provides adequate space for the formation of fan-out build-up interconnect structures for each semiconductor die 334 and singulation among the final FOWLPs. Accordingly, FIG. 13A shows a first semiconductor die 334 is mounted or disposed over carrier 360 at a point of reference R6, as measured from fiducial 364, that corresponds to the location of the first semiconductor die within the nominal panel design. Similarly, a second semiconductor die 334 is mounted or disposed over carrier 360 at a point of reference R7, as measured from one or more fiducials 364, that corresponds to the location of the second semiconductor die within the nominal panel design. Semiconductor die 334 are separated by a space or gap when mounted over carrier 360 that provides an area for a subsequently formed fan-out interconnect structure. A size of the gap includes sufficient area for optionally mounting semiconductor devices or components within the subsequently formed FOWLPs, as shown in FIG. 11A.

FIG. 13A also shows an encapsulant 366 is deposited using a paste printing, compressive molding, transfer molding, liquid encapsulant molding, vacuum lamination, spin coating, or other suitable applicator. Specifically, FIG. 13A shows a mold 368 with a plurality of inlets 370 and 372 brought together with carrier 360 and interface layer 362 to enclose semiconductor die 334 within the mold for subsequent encapsulation. Mold 368 is brought together by moving mold 368 around semiconductor die 334, or alternatively, by moving the semiconductor die into the mold. Mold 368 can include only a first or top portion that is brought together with carrier 360 and interface layer 362 without a second or bottom mold portion. In an embodiment, carrier 360 and interface layer 362 serve as the bottom mold portion for the subsequent encapsulation process. Alternatively, semiconductor die 334, carrier 360, and interface layer 362 may be disposed within a mold including multiple portions, such as top and bottom portions.

FIG. 13A further shows mold 368 encloses semiconductor die 334 with a cavity or open space 374. Cavity 374 extends between mold 368 to semiconductor die 334 and interface layer 362. A volume of encapsulant 366 is injected from dispenser 376 under an elevated temperature and pressure through inlet 370 into cavity 374 and over semiconductor die 334 and carrier 360. Inlet 372 can be an exhaust port with optional vacuum assist 378 for excess encapsulant 366. Encapsulant 366 can be a polymer composite material, such as epoxy resin with filler, epoxy acrylate with filler, or polymer with proper filler. The volume of encapsulant 366 is measured according to the space requirements of cavity 374 less the area occupied by semiconductor die 334 and any additional semiconductor devices that might be present. Encapsulant 366 is evenly dispersed and uniformly distributed under an elevated temperature within cavity 374 around semiconductor die 334. A viscosity of encapsulant 366 is selected for uniform coverage, for example, a lower viscosity increases the flow of the encapsulant for molding, paste printing, and spin coating. Semiconductor die 334 are embedded together in encapsulant 366 which is non-conductive and environmentally protects the semiconductor device from external elements and contaminants.

Figure 13B:
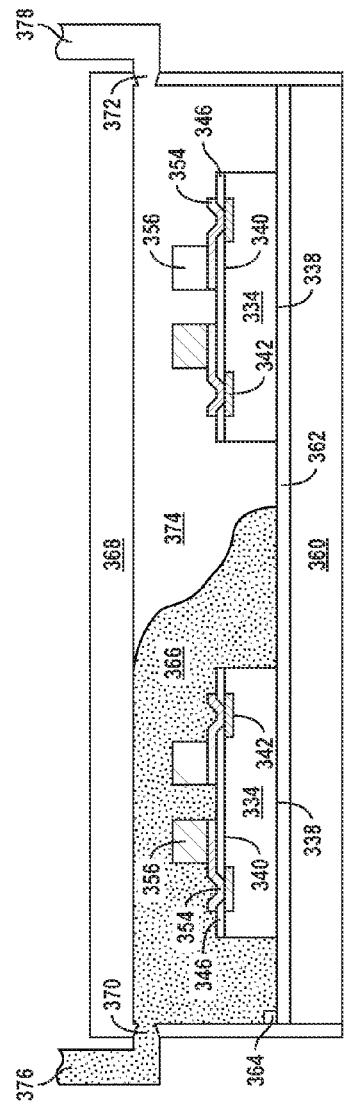

In FIG. 13B, an encapsulation process similar to the process described in relation to FIG. 13A is shown. FIG. 13B differs from FIG. 13A by the orientation of semiconductor die 334 relative to carrier 360 and interface layer 362. Instead of mounting semiconductor die 334 face down with active surface 340 oriented toward carrier 360 as shown in FIG. 13A, FIG. 13B shows an embodiment in which semiconductor die 334 are mounted face up with backsides 338 oriented toward carrier 360. Furthermore, while the processing subsequently discussed with respect to the packaging of semiconductor die 334 is shown with respect to the embodiment illustrated in FIG. 13B, the subsequent processing is likewise applicable to the embodiment shown in FIG. 13A.

In FIG. 13C, semiconductor die 334 are removed from mold 368. Carrier 360 and interface layer 362 are removed by chemical etching, mechanical peeling, CMP, mechanical grinding, thermal bake, UV light, laser scanning, or wet stripping to expose encapsulant 366. A surface of encapsulant 366 can be substantially coplanar with backside 338, which is exposed by the removal of carrier 360 and interface layer 362. Thus, the process described above with respect to FIGS. 12A-12C and FIGS. 13A-13C provide detail for a process similar to the process shown in FIG. 9. After removal of carrier 360 and interface layer 362, FIG. 13C shows encapsulant 366 disposed around semiconductor die 334 to form an embedded die panel 380. Panel 380 includes a footprint or form factor of any shape and size that allows for, and facilitates, the subsequent processing required to form FOWLPs as described in greater detail below. In an embodiment, panel 380 includes a form factor similar to the form factor of a 300 mm semiconductor wafer and includes a circular footprint having a diameter of 300 mm.

FIG. 13C also shows panel 380 undergoes an optional grinding operation with grinder 382 to planarize the surface and reduce a thickness of the panel. A chemical etch can also be used to remove and planarize a portion of encapsulant 366 in panel 380. Thus, a surface of interconnects 356 is exposed with respect to encapsulant 366 at a periphery of panel 380 to electrically connect semiconductor die 334 to a subsequently formed fan-out interconnect structure.

In FIG. 13C, an optional backside coating 384, similar to backside coating 344 in FIG. 12A, is formed over backside 338 of semiconductor die 334 and over a surface of encapsulant 366 that is substantially coplanar with backside 338. Backside coating 384 is a polymer layer, dielectric film, epoxy film, or other suitable material having similar insulating and structural properties that can contain one or more layers of $SiO_2$, $Si_3N_4$, SiON, $Ta_2O_5$, $Al_2O_3$, polyimide, BCB, and PBO. Backside coating 384 can be formed by a lamination process, molding process, or other suitable process. In an embodiment, backside coating 384 is an optically transparent material that facilitates optical scanning of objects within panel 380, such as semiconductor die 334, interconnects 356, and fiducials 364. In another embodiment, backside coating 384 is one or more layers of a thermally conductive material such as Al, Cu, Ni, Cu and Ni, or other suitable material with high thermal conductivity that is formed by a process such as printing, PVD, CVD, sputtering, electrolytic plating, electroless plating, metal evaporation, metal sputtering, or other suitable process. Thermally conductive backside coating 384 forms a thermally conductive path that aids with distribution and dissipation of heat generated by semiconductor die 334 and increases the thermal performance of the subsequently formed FOWLPs. Alternatively, optional backside coating 384 is omitted such that backside 338 remains exposed as part of a final package. Backside coating 384 can be formed on panel 380 before or after a portion of encapsulant 366 is removed from the panel.

FIG. 13D shows scanner 386 inspecting panel 380 to determine a true or actual position of semiconductor die 334 within panel 380. Scanner 386 uses optical imaging, acoustic imaging, magnetic imaging, radiofrequencies, infrared, or other suitable process to determine a true or actual position of semiconductor die 334, or other object including optional semiconductor devices, similar to semiconductor device 246 in FIG. 11A, within panel 380. The true position and rotation of each semiconductor die 334 or other object is determined with respect to a global point of reference R8 on panel 380. Point of reference R8 can include a number of fiducials 364 transferred from carrier 360 with the formation of encapsulant 366 and the removal of carrier 360 and interface layer 362. Point of reference R8 further includes a number of new fiducial alignment marks that are positioned over or attached to panel 380, or are formed by marking or removing a portion of panel 380. Alternatively, point of reference R8 is not physically identified as part of panel 380, but instead is associated with a portion of scanner 386 or an attachment point between panel 380 and scanner 386.

Scanner 386 inspects features on each semiconductor die 334 to determine actual position and rotation of every semiconductor die 334 on panel 380 with respect to point of reference R8. The features identified by scanner 386 on each semiconductor die 334 include a location of an edge or corner of the semiconductor die, a position of interconnect 356 including a corner, center, or outline of the interconnect, or any other feature on or associated with the semiconductor die. The actual or measured position of semiconductor die 334 includes an x-y position that accounts for a lateral or translational shift in one or more directions of the semiconductor die with respect to point of reference R8 within panel 380. Similarly, the actual or measured position of semiconductor die 334 also includes an orientation or angular rotation with respect to point of reference R8.

As illustrated in FIG. 13D, first semiconductor die 334 is encapsulated within panel 380 and is located at point of reference R9, which is measured with respect to point of reference R8. Similarly, second semiconductor die 334 is encapsulated within panel 380 at a point of reference R10, which is measured with respect to point or reference R8. When semiconductor die 334 are precisely and accurately placed at points of reference R6 and R7, and the semiconductor die do not undergo any movement or shifting during encapsulation, R6 and R7 are equal to R9 and R10, respectively. However, movement of semiconductor die 334 from the nominal position of the predetermined panel design results in points of reference R9 and R10 being different from points of reference R6 and R7, respectively. Movement of semiconductor die 334 away from their nominal positions and point of reference R8 results from inaccuracies in mounting the semiconductor die over carrier 360. Additionally, movement of semiconductor die 334 also results from shifts in the position of the semiconductor die, which occur during encapsulation. For example, a force resulting from encapsulant 366 contacting semiconductor die 334 can cause semiconductor die 334 and interconnects 356 to shift with respect to point of reference R8 and shift with respect to the nominal position of the semiconductor die within the predetermined panel design, that is, points of reference R6 and R7.

After the true position and orientation of each semiconductor die 334 and interconnect 356 within panel 380 is determined by scanner 386, the true positions of the semiconductor die, for example R9 and R10, are compared to the nominal positions of the semiconductor die within the nominal panel design, for example R6 and R7, to determine the change of position or shift of each semiconductor die 334 and interconnect 356 that occurred during processing. By ascertaining the difference in position between the nominal or original design position of semiconductor die 334 and the actual position of the semiconductor die and interconnects, potential problems with the subsequent formation of a fan-out build-up interconnect structure over the semiconductor can be identified and averted. A potential problem exists if a true position of a semiconductor die 334, for example, R9 and R10, has shifted such that the true position of an interconnect 356 will no longer align or provide a good electrical connection with the subsequently formed fan-out build-up interconnect structure. The fan-out build-up interconnect structure as originally designed for panel 380 will not align with some semiconductor die 334 or interconnects 356 because the build-up interconnect structure as originally designed is based on the nominal positions of the semiconductor die within the panel design, for example R6 and R7, and not the actual or true position of semiconductor die 334 and interconnects 356 after having been formed as part of panel 380, for example R9 and R10. Accordingly, at least a portion of the original design of the fan-out build-up interconnect structure is modified before being applied to panel 380 to avoid the problems of misalignment and inadequate electrical connections between the interconnect structure and semiconductor die 334. In an embodiment, position data for semiconductor die 334 and interconnects 356 are imported into an adaptive pattern autorouter, which accounts for the true or measured positions of semiconductor die 334 and produces a new design that adjusts or selects new locations for at least a portion of the fan-out build-up interconnect structure, for example, vias, RDLs, pads, and traces, to connect to interconnects 356 of semiconductor die 334. Individual package designs are combined to form a drawing of the full panel for each of the layers that need to be adjusted. The difference in shift from nominal to true positions dictates how the individual package designs are combined to form the full panel design. In an embodiment, design files for each panel are imported to a lithography machine that uses the design data to dynamically apply a custom, adaptive pattern to each panel.

FIG. 13E shows an insulating or passivation layer 388 conformally applied over panel 380 and interconnects 356. Insulating layer 388 includes one or more layers that are applied using PVD, CVD, screen printing, spin coating, spray coating, sintering, or thermal oxidation. Insulating layer 388 contains one or more layers of SiO2, Si3N4, SiON, Ta2O5, Al2O3, polyimide, BCB, PBO or other material having similar insulating and structural properties. In an embodiment, passivation layer 388 is an optional polymer layer. Openings are formed completely through insulating layer 388 to expose at least a portion of conductive layer 342 for subsequent electrical connection. Alternatively, because insulating layer 388 is optional, conductive layer 342 is exposed for subsequent electrical interconnection in the absence of forming the insulating layer.

In FIG. 13E, a portion of insulating layer 388 is removed by etching, laser drilling, mechanical drilling, or other suitable process to form openings completely through insulating layer 388 to expose interconnects 356. When changes in the positions of semiconductor die 334 and interconnects 356 are small with respect to point of reference R8, no adjustments to the positions of the openings in insulating layer 388 may be required to properly align the openings with interconnects 356. Thus, the adaptive patterning for packaging semiconductor die 334 includes measuring the true position of semiconductor die 334 or interconnects 356, and determining whether the shifts or movement of the semiconductor die require changes to the predetermined positions of openings in insulating layer 388. If the changes in position of interconnects 356 are such that the nominal position of openings in insulating layer 388 do not provide adequate exposure of the interconnects, then adjustments to the position of openings in the insulating layer will be made.

Adaptive patterning can adjust the position of each opening in insulating layer 388 individually, or can adjust positions of a number of openings simultaneously. For example, a number of openings form a unit pattern that relates to interconnects 356 for a single semiconductor die 334 within panel 380, which are adjusted together as a unit. The positions of openings in insulating layer 388 are adjusted, either individually or in groups, as described above with respect to openings 282 shown in FIG. 11D. For example, openings in insulating layer 388 are adjusted by an x-y translation or by rotation of an angle θ with respect to point of reference R8 on panel 380.

FIG. 13E also shows an electrically conductive layer or RDL 390 is patterned and deposited over insulating layer 388 and interconnects 356 as a fan-out RDL. Conductive layer 390 can be one or more layers of Al, Cu, Sn, Ni, Au, Ag, or other suitable electrically conductive material. The deposition of conductive layer 390 uses PVD, CVD, electrolytic plating, electroless plating, or other suitable process. In an embodiment, conductive layer 390 is an RDL comprising a TiW seed layer, a Cu seed layer, and Cu layer formed over the TiW seed layer and the Cu seed layer. Conductive layer 390 provides electrical interconnection between electrical interconnects 356 and subsequently formed bumps or package interconnects that provide for the transmission of electrical signals between semiconductor die 334 and points external to the FOWLP. When changes in the position of a semiconductor die 334 and interconnects 356 are small with respect to point of reference R8, forming conductive layer 390 according to a nominal or original design may be sufficient for providing electrical connection between interconnects 356 and subsequently formed bumps or package interconnects without additional adjustments or adaptive patterning. Conversely, when the measured position of a semiconductor die 334 and interconnects 356 vary from nominal positions sufficiently that formation of conductive layer 390 according to its nominal design could lead to poor electrical connections between interconnects 356 and subsequently formed bumps or package interconnects, additional adjustment or adaptive patterning of conductive layer 390 is desirable.

Different approaches for adjusting a position of conductive layer 390 to align with the true or actual position of semiconductor die 334 within panel 380 can be used. First, each unit-specific pattern of conductive layer 390 associated with each semiconductor die 334 can be uniquely and individually designed based on the locations of semiconductor die 334 and based on the locations of a final interconnect structure for each FOWLP, such as a location of conductive bumps. Increased flexibility for matching a position of conductive layer 390 to each semiconductor die 334 and to a location of the final interconnect structure can be achieved by calculating a unique or complete custom RDL pattern for each semiconductor die 334 within panel 380.

A second approach for adjusting a position of conductive layer 390 to align with the true or actual position of semiconductor die 334 within panel 380 includes associating each unit-specific pattern of conductive layer 390 with each semiconductor die 334 by forming the conductive layer with a first fixed portion and second adaptable portion. The first portion of the conductive layer, also referred to as a fixed partial pattern or prestratum, is fixed with respect to an outline of each FOWLP and BGA array. The first portion of conductive layer 390 can include capture pads for subsequent pattern layers such as UBM structures. The second portion of conductive layer 390 is formed after the first portion is formed and after measuring an actual position and orientation of semiconductor die 334 or interconnects 356, for example by measuring points of reference R9 and R10. The second portion of conductive layer 390 is formed so as to complete the connection between the first portion of the conductive layer to interconnects 356 and to the location where conductive layer 390 connects to the package or final interconnect structure such as solder bumps. In an embodiment, the second portion of conductive layer 390 is smaller than the first portion of the conductive layer. Preferably, the second portion of conductive layer 390 or the adaptive region in which conductive layer 390 is dynamically changed to accommodate changes between the nominal and actual positions of semiconductor die 334 is typically on the order of 100 μm to 200 μm.

A third approach for adjusting a position of conductive layer 390 to align with the true or actual position of semiconductor die 334 within panel 380 includes generating a discrete number of fixed generic patterns for conductive layer 390 during the initial design process. Each generic pattern is applicable to a subset of the possible die shifts defined by the process capability of the panelization process. Accordingly, based on the true or measured position for each of semiconductor die 334 and interconnects 356 within panel 380, a "best fit" pattern can be selected from the discrete number of fixed generic patterns and matched to a particular semiconductor die within the panel.

FIG. 13E shows an insulating or passivation layer 392 conformally applied over panel 380 and conductive layer 390. Insulating layer 392 includes one or more layers that are applied using PVD, CVD, screen printing, spin coating, spray coating, sintering, or thermal oxidation. Insulating layer 392 contains one or more layers of $SiO_2$, $Si_3N_4$, SiON, $Ta_2O_5$, $Al_2O_3$, polyimide, BCB, PBO or other material having similar insulating and structural properties. In an embodiment, passivation layer 392 is a polymer layer.

In FIG. 13E, a portion of insulating layer 392 is removed by etching, laser drilling, mechanical drilling, or other suitable process to form openings completely through insulating layer 392 and to expose at least a portion of conductive layer 390 for subsequent electrical interconnection. Locations for the openings in insulating layer 392 are formed at nominal locations with respect to an outer profile or package edge. The openings formed in insulting layer 392 are not part of the adaptive patterning employed in adjusting locations of openings in insulating layer 388 or adjusting a location of conductive layer 390. By not adjusting a location of the openings in insulating layer 392 based on measured positions of semiconductor die 334 and interconnects 356, a location of package interconnects, such a solder bumps, remains fixed with respect to an outer edge or profile of the FOWLPs and does not vary with movement or shifting of semiconductor die 334.

FIG. 13F is a plan view of a portion embedded die panel 380 from FIG. 13E before the formation of insulating layer 392. FIG. 13F shows semiconductor die 334 and interconnects 356 embedded within encapsulant 366. Insulating layer 388 is optionally formed over semiconductor die 334 and encapsulant 366 with openings formed over interconnects 356 for subsequent mechanical and electrical interconnection according to the design and function of semiconductor die 334. As discussed above in relation to FIG. 13E, conductive layer 390 can be formed in one or more portions at one or more times. FIG. 13F shows an embodiment in which a first portion or prestratum 390a of conductive layer 390 is shown disposed over semiconductor die 334, encapsulant 366, and insulating layer 388. First portion 390a of conductive layer 390 can be formed as a fan-out RDL layer, and is formed according to nominal positions of semiconductor die 334, such as point of reference R6 or R7. In an embodiment, first portion 390a is created in a traditional layout tool, such as Cadence. An optimum design including a location and spacing of various parts of first portion 390a ensures interconnects 356 can be subsequently connected to first portion 390a with sufficient space and acceptable pitch without causing problems such as electrical short-circuiting. In an embodiment, determining an optimum design for first portion 390a uses a Monte Carlo analysis to consider the routability of the design. Routability of the design can be considered for all possible semiconductor die shifts or for an expected range of die shifts resulting from the panelization process. In an embodiment, semiconductor die shifts in x and y directions of up to +/−80 µm and rotation up to +/−0.5 degrees are considered. Accordingly, design rule violations or routing errors that may have occurred can be characterized quickly in the design environment and corrected by adjusting the prestratum design prior to prototyping.

FIG. 13G, continuing from FIG. 13F, shows a second portion 390b of conductive layer 390 disposed over semiconductor die 334, interconnect 356, encapsulant 366, and insulating layer 388. Second portion 390b of conductive layer 390 is formed according to actual positions of semiconductor die 334 and interconnects 356, using for example measured points of reference R9 and R10, and also connects to first portion 390a of conductive layer 390. In an embodiment, second portion 390b is formed after the formation of first portion 390a. Alternatively, portions 390 and 390b are formed simultaneously. Thus, taken together, first portion 390a and second portion 390b form a complete RDL design wherein the prestratum pattern is connected to interconnects 356 and semiconductor die 334. While a design or pattern of first portion 390a remains constant, adapting a pattern or design of second portion 390b ensures contact is made with interconnect 356 notwithstanding changes or shifts in position of semiconductor die 334.

Figure 13H:
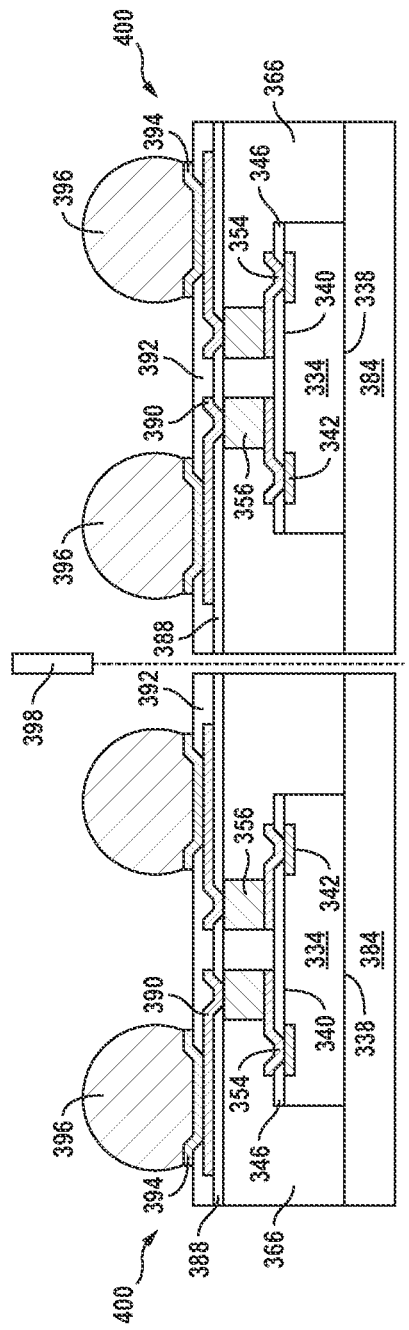

FIG. 13H shows UBMs 394 formed over conductive layer 390 and insulating layer 392. UBMs 394 can be multiple metal stacks including adhesion, barrier, seed, and wetting layers. Layers of UBM 394 can be Ti, TiN, TiW, Al, Cu, Cr, CrCu, Ni, NiV, Pd, Pt, Au, and Ag. In an embodiment, UBMs 394 comprise a TiW seed layer, a Cu Seed layer, and a Cu UBM layer. The TiW seed layer is conformally applied over insulating layer 392 and extends into the openings formed in insulating layer 392 and is conformally applied over a portion of conductive layer 390. The Cu seed layer is conformally applied over the TiW seed layer. The Cu UBM layer is conformally applied over the TiW seed layer and the Cu seed layer. UBMs 394 act as an intermediate conductive layer between conductive layer 390 and subsequently formed solder bumps or other I/O interconnect structures. UBMs 394 can provide a low resistive interconnect to conductive layer 390, a barrier to solder diffusion, and an increase in solder wettability.

An electrically conductive bump material is deposited over UBMs 394 and conductive layer 390 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBMs 394 using a suitable attachment or bonding process. In an embodiment, the bump material is reflowed by heating the material above its melting point to form spherical balls or bumps 396. In some applications, bumps 396 are reflowed a second time to improve electrical contact to UBMs 394. The bumps can also be compression bonded to UBMs 394. Bumps 396 represent one type of interconnect structure that can be formed over UBMs 394. The interconnect structure can also use conductive paste, stud bump, micro bump, or other electrical interconnect.

After the formation of bumps 396, panel 380 is singulated between semiconductor die 334 using a saw blade or laser cutting tool 398 into individual FOWLPs 400.

Figure 14:
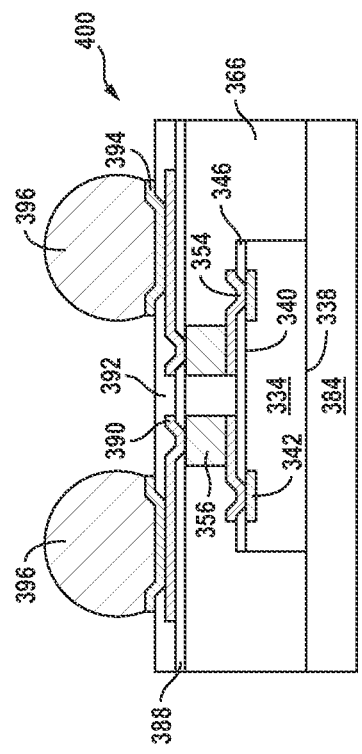
FIG. 14 illustrates an embodiment of a FOWLP in accordance with an embodiment of the disclosure.

FIG. 14, continuing from FIG. 13H, shows a completed FOWLP 400. FOWLP 400 includes semiconductor die 334 with optional insulating layer 346, such as polymer, disposed over active surface 340 of the semiconductor die. Conductive layer 354 is formed as a fan-in interconnect structure that connects to contact pads 342 and interconnects or copper pillars 356. Because conductive layer 354 and interconnect structures or copper pillars 356 are formed at the wafer level before singulation of semiconductor die 334, the conductive layer and interconnect structures or copper pillars are formed without adaptive patterning because no shifting has occurred during formation of a reconstituted wafer or embedded die panel. Semiconductor die 334, conductive layer or fan-in RDL 354, and interconnect structures 356 are encapsulated with encapsulant 366. Backside coating 384 is disposed over and contacts backside 338 of the semiconductor die 334 and encapsulant 366 formed around a periphery of semiconductor die 334. Backside coating 384 includes a footprint or area equal to a footprint or area of FOWLP 400. Insulating layer 388 is formed over FOWLP 400 opposite backside coating 384. Conductive layer 390 is formed as a fan-out RDL that extends outward from a center of FOWLP 400, and is further formed as a unit-specific pattern that aligns with the true position of each semiconductor die 334 or interconnect structure 356. Insulating layer 392 is formed over conductive layer 390 and insulating layer 388. Openings in insulating layer 392 are formed over a portion of conductive layer 390. UBMs 394 are conformally formed over insulating layer 392 and portions of conductive layer 390. One or more UBMs 394 can be partially or completely within a footprint of semiconductor die 334. Alternatively, one or more UBMs 394 can be formed completely outside a footprint of semiconductor die 334. Bumps 396 are formed over UBMs 394 to provide package input/output (I/O) interconnects for FOWLP 400. In an embodiment, a plurality of bumps 396 form an array of bumps or land grid array (LGA) aligned with a periphery or outer profile of FOWLP 400.

Figure 15:
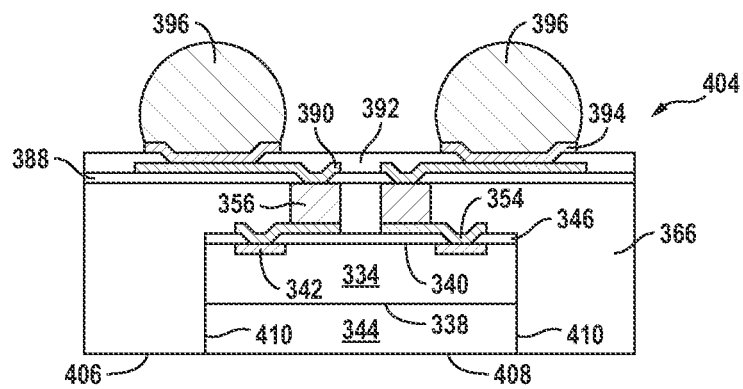
FIG. 15 illustrates an embodiment of a FOWLP in accordance with an embodiment of the disclosure.

FIG. 15 shows a FOWLP 404 similar to FOWLP 400 from FIG. 14. FOWLP 404 differs from FOWLP 400 by the inclusion of backside coating 344 from FIG. 12A rather than backside coating 384. By forming backside coating 344 over backside 338 of semiconductor die 334 before the formation of encapsulant 366, surface 406 of encapsulant 366 is formed opposite insulating layer 388 and is substantially coplanar with surface 408 of backside coating 344 formed over semiconductor die 334. Additionally, encapsulant 366 contacts side surfaces 410 of backside coating 344 between backside 338 and surface 408, which differs from similar side surfaces of backside coating 384 in FOWLP 400 that are left exposed with respect to encapsulant 366 in FOWLP 400.

Figure 16:
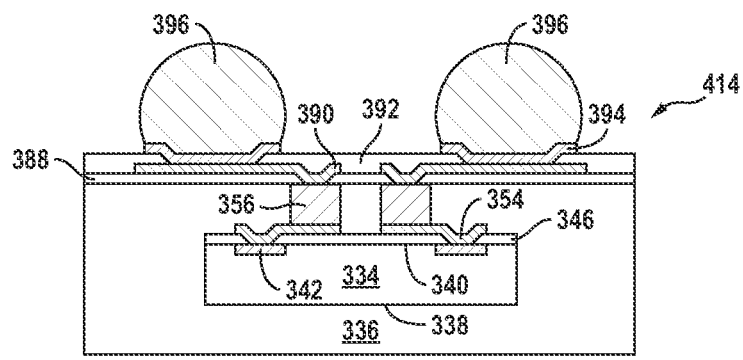
FIG. 16 illustrates an embodiment of a FOWLP in accordance with an embodiment of the disclosure.

FIG. 16 shows FOWLP 414 similar to FOWLP 400 from FIG. 14. FOWLP 414 differs from FOWLP 400 by the omission of backside coating 384 and by the formation of encapsulant 366. Encapsulant 366 in FIG. 16 is disposed over backside 338 of semiconductor die 334, and encapsulation of the semiconductor can by accomplished by mounting semiconductor die 334 face down during encapsulation as described above with respect to FIG. 13A.

Figure 17:
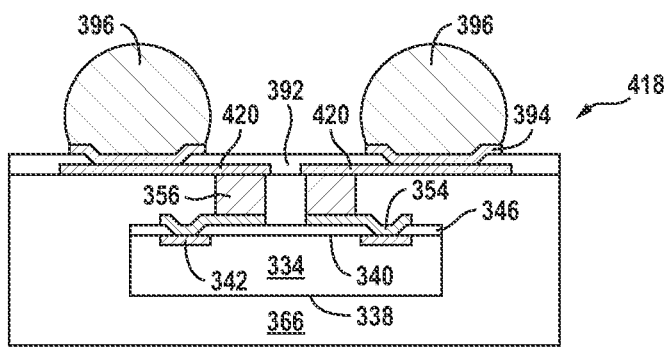
FIG. 17 illustrates an embodiment of a FOWLP in accordance with an embodiment of the disclosure.

FIG. 17 shows FOWLP 418 similar to FOWLP 414 from FIG. 16. FOWLP 418 differs from FOWLP 414 by the omission of insulating layer 388 and by the formation of conductive layer 420 as a fan-out RDL directly on encapsulant 366. Conductive layer 420, like conductive layer 390, can be one or more layers of Al, Cu, Sn, Ni, Au, Ag, or other suitable electrically conductive material. The deposition of conductive layer 420 uses PVD, CVD, electrolytic plating, electroless plating, or other suitable process. In an embodiment, conductive layer 420 is an RDL comprising a TiW seed layer, a Cu seed layer, and Cu layer formed over the TiW seed layer and the Cu seed layer. Conductive layer 420 provides electrical interconnection between electrical interconnects 356 and UBMs 394 and bumps 396. Different approaches for adjusting a position of conductive layer 420 to align with the true or actual position of semiconductor die 334 can be used as discussed above, for example, with respect to conductive layer 390 in FIG. 13E. Encapsulant 366 in FIG. 16 is disposed over backside 338 of semiconductor die 334, and encapsulation of the semiconductor die can by accomplished by mounting semiconductor die 334 face down during encapsulation as described above with respect to FIG. 13A.

Figure 18:
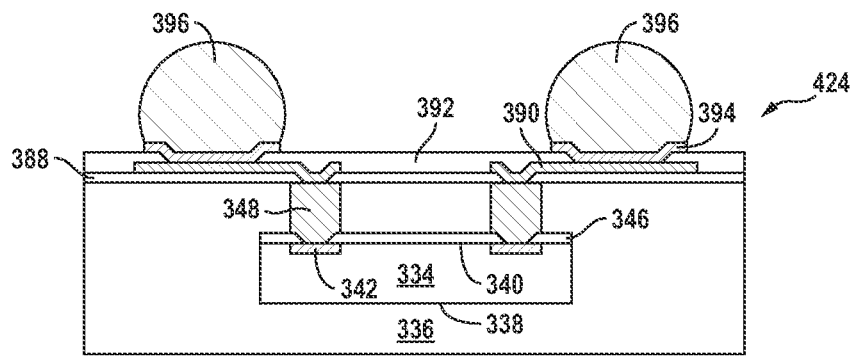
FIG. 18 illustrates an embodiment of a FOWLP in accordance with an embodiment of the disclosure.

FIG. 18 shows FOWLP 424, which is similar to FOWLP 414 from FIG. 16. FOWLP 424 differs from FOWLP 414 by the omission of conductive layer 354. Furthermore, instead of forming interconnect structures 356 on a fan-in RDL as shown in FIG. 16, in FIG. 18 interconnect structures or copper pillars 348 are formed directly on contact pads 342. As shown in FIG. 12B, interconnect structures 348 are preferably formed at the wafer level before singulation of semiconductor wafer 330 such that adaptive patterning is not required for the formation of the interconnect structures. Instead, adaptive patterning is used in the formation of a unit-specific pattern or the placement of conductive layer 390 that aligns with interconnects structures 348.

Figure 19:
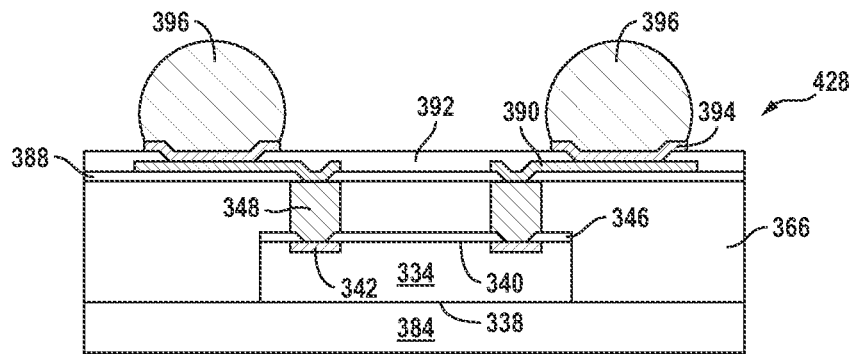
FIG. 19 illustrates an embodiment of a FOWLP in accordance with an embodiment of the disclosure.

FIG. 19 shows FOWLP 428, which is similar to FOWLP 400 from FIG. 14. FOWLP 428 differs from FOWLP 400 by the omission of conductive layer 354. Furthermore, instead of forming interconnect structures 356 on a fan-in RDL as shown in FIG. 14, in FIG. 19 interconnect structures or copper pillars 348 are formed directly on contact pads 342. As shown in FIG. 12B, interconnect structures 348 are preferably formed at the wafer level before singulation of semiconductor wafer 330 such that adaptive patterning is not required for the formation of the interconnect structures. Instead, adaptive patterning is used in the formation of a unit-specific pattern or the placement of conductive layer 390 that aligns with interconnects structures 348.

Figure 20:
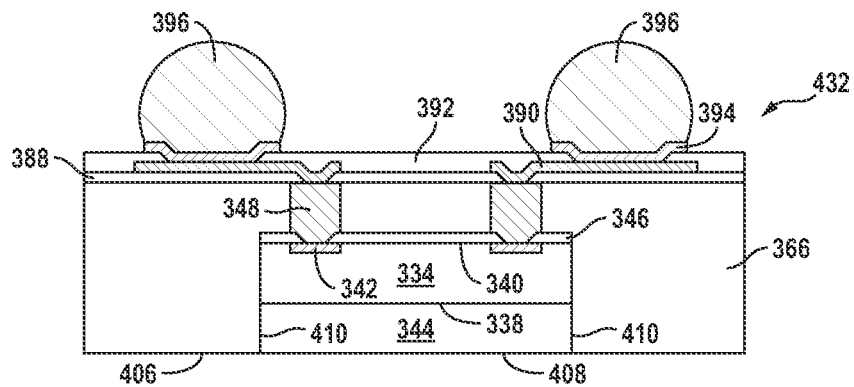
FIG. 20 illustrates an embodiment of a FOWLP in accordance with an embodiment of the disclosure.

FIG. 20 shows FOWLP 432, which is similar to FOWLP 404 from FIG. 15. FOWLP 432 differs from FOWLP 404 by the omission of conductive layer 354. Furthermore, instead of forming interconnect structures 356 on a fan-in RDL as shown in FIG. 15, in FIG. 20 interconnect structures or copper pillars 348 are formed directly on contact pads 342. As shown in FIG. 12B, interconnect structures 348 are preferably formed at the wafer level before singulation of semiconductor wafer 330 such that adaptive patterning is not required for the formation of the interconnect structures. Instead, adaptive patterning is used in the formation of a unit-specific pattern or the placement of conductive layer 390 that aligns with interconnects structures 348.

Figure 21:
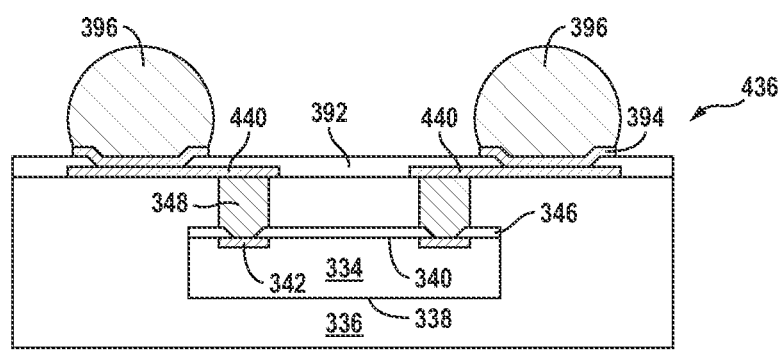
FIG. 21 illustrates an embodiment of a FOWLP in accordance with an embodiment of the disclosure.

FIG. 21 shows FOWLP 436, which is similar to FOWLP 418 from FIG. 17. FOWLP 436 differs from FOWLP 418 by the omission of conductive layer 354. Furthermore, instead of forming interconnect structures 356 on a fan-in RDL as shown in FIG. 17, in FIG. 21 interconnect structures or copper pillars 348 are formed directly on contact pads 342. As shown in FIG. 12B, interconnect structures 348 are preferably formed at the wafer level before singulation of semiconductor wafer 330 such that adaptive patterning is not required for the formation of the interconnect structures. Instead, adaptive patterning is used in the formation of a unit-specific pattern or the placement of conductive layer 440 that aligns with interconnect structures 348. Conductive layer 440 is similar to conductive layer 420 from FIG. 17, and is formed directly on encapsulant 366 instead of on an additional insulating layer such as insulating layer 388.

Figure 22:
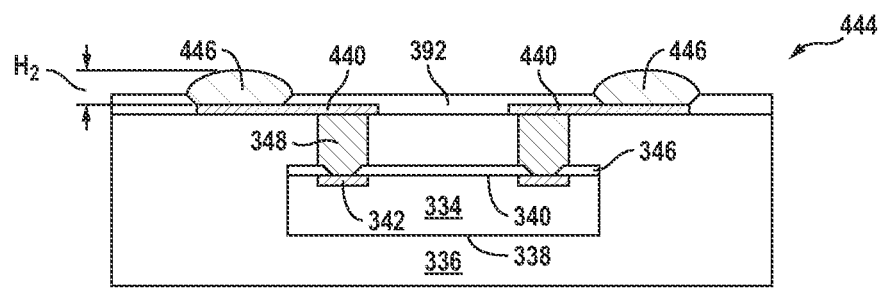
FIG. 22 illustrates an embodiment of a FOWLP in accordance with an embodiment of the disclosure.

FIG. 22 shows FOWLP 444, which is similar to FOWLP 436 from FIG. 21. FOWLP 444 differs from FOWLP 436 by the omission of UBMs 394 and the formation of low profile bumps 446 directly on conductive layer 440. In an embodiment, a plurality of low profile bumps 446 forms an array of bumps or LGA aligned with a periphery or outer profile of FOWLP 444. Preferably, a height H2 of low profile bumps 446 is in a range of 20 μm to 125 μm.

In the foregoing specification, various embodiments of the disclosure have been described. It will, however, be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A method of making a plurality of semiconductor packages, comprising:
    providing a plurality of semiconductor die comprising a copper column disposed over the active surface of each of the semiconductor die;
    forming an embedded die panel by disposing an encapsulant around each of the semiconductor die;
    measuring a true position of each semiconductor die within the embedded die panel; and
    forming a plurality of unit-specific patterns over the plurality of semiconductor die and on a surface of the embedded die panel using a mask-less patterning system to align one of the plurality of unit-specific patterns with the true position of each semiconductor die in the embedded die panel; and
    singulating the embedded die panel to form the plurality of semiconductor packages comprising semiconductor die and unit-specific patterns over the semiconductor die.

2. The method of claim 1, further comprising forming the embedded die panel by:
    providing a carrier;
    mounting the plurality of semiconductor die face down on the carrier; and
    disposing the encapsulant around each of the plurality of semiconductor die and around each copper column.

3. The method of claim 1, further comprising forming the embedded die panel by:
   providing a carrier;
   mounting the plurality of semiconductor die face up on the carrier; and
   disposing the encapsulant around each of the plurality of semiconductor die and around each copper column.

4. The method of claim 3, further comprising removing the carrier to expose a backside of each semiconductor die.

5. The method of claim 1, further comprising:
   forming a fan-in redistribution layer (RDL) extending over the active surface of each semiconductor die; and
   forming the copper columns over the fan-in RDL.

6. The method of claim 1, further comprising forming the unit-specific pattern as a fan-out structure disposed over the plurality of semiconductor die, over the encapsulant, and coupled to the copper columns.

7. The method of claim 1, further comprising forming the unit-specific pattern as a unique unit-specific pattern comprising a conductive layer formed over the encapsulant and coupled to the copper columns.

8. A method of making a plurality of semiconductor packages, comprising:
   providing a plurality of semiconductor die comprising an interconnect structure disposed over the active surface of each semiconductor die;
   forming an embedded die panel by disposing an encapsulant around each of the plurality of semiconductor die;
   measuring a true position of each semiconductor die within the embedded die panel; and
   forming a unit-specific pattern over each of the semiconductor die with a mask-less patterning system to align each of the unit-specific patterns with the true position of each respective semiconductor die in the embedded die panel; and
   singulating the embedded die panel to form the plurality of semiconductor packages.

9. The method of claim 8, wherein providing the interconnect structures further comprises forming the interconnect structures as copper columns.

10. The method of claim 9, further comprising:
    forming each of the semiconductor die comprising a contact pad; and
    forming the copper columns over the contact pads of each of the respective semiconductor die.

11. The method of claim 8, further comprising forming bumps over each of the interconnect structures such that the bumps align with a respective outline of each of the semiconductor packages.

12. The method of claim 8, further comprising forming a backside coating over a backside of each of the plurality of semiconductor die before forming the encapsulant around the semiconductor die.

13. The method of claim 8, further comprising disposing a backside coating over a backside of each of the plurality of semiconductor die and over a surface of the encapsulant disposed around the plurality of semiconductor die.

14. The method of claim 8, further comprising measuring the true position of each semiconductor die with respect to a global fiducial.

15. A method of making a semiconductor package, comprising:
   providing a die panel comprising a semiconductor die embedded in an encapsulant with an interconnect structure coupled to an active surface of the semiconductor die;
   measuring a true position of the interconnect structure within the die panel; and
   forming a unit-specific pattern over the semiconductor die with a mask-less patterning system to align the unit-specific pattern with the true position of the interconnect structure.

16. The method of claim 15, further comprising forming the encapsulant around the semiconductor die without forming the encapsulant over backsides of the semiconductor die such that the backsides of the semiconductor die are exposed with respect to the encapsulant.

17. The method of claim 15, further comprising forming the unit-specific patterns to align with the true position of each semiconductor die in the die panel by selecting from a number of pre-determined unit-specific pattern designs a unit-specific pattern with a best fit for the true position of each of the plurality of semiconductor die.

18. The method of claim 15, further comprising forming a bump over the unit-specific pattern such that the bump is aligned with an outline of the semiconductor package.

19. The method of claim 15, wherein providing the interconnect structures further comprises forming the interconnect structures as copper columns.

20. The method of claim 19, further comprising:
    forming the unit-specific pattern as a conductive layer;
    forming an insulating layer of polybenzoxazoles, polyimide, or epoxy solder mask over the unit-specific pattern;
    forming openings in the insulating layer over the unit-specific pattern to define land grid array pads; and
    forming low profile bumps over the land grid array pads.

* * * * *